United States Patent
Benvenuti et al.

(10) Patent No.: US 10,280,506 B2
(45) Date of Patent: May 7, 2019

(54) DEPOSITION PROCESS BASED ON STENCIL MASK AND APPLICATION TO THE FABRICATION OF TAGS SUPPORTING MULTI-FUNCTIONAL TRACEABLE CODES

(71) Applicant: 3D-Oxides, Saint-Genis-Pouilly (FR)

(72) Inventors: Giacomo Benvenuti, Saint-Genis-Pouilly (FR); Estelle Wagner, Saint-Genis-Pouilly (FR); Cosmin Sandu, Saint-Genis-Pouilly (FR)

(73) Assignee: 3D-OXIDES, Saint-Genis-Pouilly (FR)

( * ) Notice: Subject to any disclaimer, the term of this patent is extended or adjusted under 35 U.S.C. 154(b) by 24 days.

(21) Appl. No.: 15/126,310

(22) PCT Filed: Mar. 18, 2015

(86) PCT No.: PCT/IB2015/051983
§ 371 (c)(1),
(2) Date: Sep. 15, 2016

(87) PCT Pub. No.: WO2015/140731
PCT Pub. Date: Sep. 24, 2015

(65) Prior Publication Data
US 2017/0081756 A1 Mar. 23, 2017

(30) Foreign Application Priority Data

Mar. 18, 2014 (WO) .................. PCT/IB2014/000802

(51) Int. Cl.
*C23C 16/04* (2006.01)
*B65C 9/00* (2006.01)
(Continued)

(52) U.S. Cl.
CPC ............ *C23C 16/042* (2013.01); *B42D 25/41* (2014.10); *B42D 25/415* (2014.10); *B65C 9/00* (2013.01);
(Continued)

(58) Field of Classification Search
CPC .................................................. C23C 16/042
See application file for complete search history.

(56) References Cited

U.S. PATENT DOCUMENTS

| 6,045,671 A | 4/2000 | Wu et al. |
| 6,911,129 B1 | 6/2005 | Li |

(Continued)

FOREIGN PATENT DOCUMENTS

| WO | WO2012128724 A1 | | 9/2012 |
| WO | WO2013/020589 | * | 2/2013 |

OTHER PUBLICATIONS

E.W.T. Ngai, et al. "RFID Research: An Academic Literature Review (1995-2005) and Future Research Directions" Int. J. Production Economics 112 (2008) 510-520.
(Continued)

*Primary Examiner* — Joseph A Miller, Jr.
(74) *Attorney, Agent, or Firm* — King & Schickli, PLLC

(57) ABSTRACT

A chemical gas phase deposition process comprises steps of providing a high vacuum chamber, and inside the high vacuum chamber: positioning a substrate surface; positioning a mask parallel to the substrate surface, whereby the mask comprises one or more openings; adjusting a gap of determined dimension between the substrate surface and the mask; and orienting a plurality of chemical precursor beams of at least one precursor species towards the mask with line of sight propagation, each of the plurality of chemical precursor beams being emitted from an independent punctual source, and molecules of the chemical precursor pass
(Continued)

through the one or more mask openings to impinge onto the substrate surface for deposition thereon. At least a part of the chemical precursor molecules decompose on the substrate surface at a decomposition temperature. The process further comprises adjusting a temperature of the substrate surface greater or equal to the chemical precursor molecule decomposition temperature, thereby remaining greater than a mask temperature, and maintaining the mask temperature below the decomposition temperature, thereby causing a decomposition of the chemical precursor and a growth of a film on the substrate surface, but not on the mask; and heating the substrate surface using a heating device.

17 Claims, 8 Drawing Sheets

(51) Int. Cl.
    *C23C 16/40*     (2006.01)
    *C23C 16/46*     (2006.01)
    *C23C 16/52*     (2006.01)
    *G09F 3/00*     (2006.01)
    *B42D 25/41*     (2014.01)
    *B42D 25/415*     (2014.01)
    *B65D 79/00*     (2006.01)

(52) U.S. Cl.
    CPC .............. *B65D 79/00* (2013.01); *C23C 16/40* (2013.01); *C23C 16/46* (2013.01); *C23C 16/52* (2013.01); *G09F 3/00* (2013.01)

(56) References Cited

U.S. PATENT DOCUMENTS

| | | | | |
|---|---|---|---|---|
| 2003/0124764 | A1* | 7/2003 | Yamazaki | B05D 1/60 438/99 |
| 2009/0286342 | A1* | 11/2009 | Takahashi | B82Y 20/00 438/32 |
| 2010/0227060 | A1 | 9/2010 | Na et al. | |

OTHER PUBLICATIONS

RFID Frequently Asked Question—RFID Journal, https://www.rfidjournal.com/faq/show?85.
Alvaro A. Cardenas, et al. "Big Data Analytics for Security" IEEE Security & Privacy, Copublished by the IEEE Computer and Reliability Societies, Nov./Dec. 2013.
Carlo Maria Medaglia, et al. "An Overview of Privacy and Security Issues in the Internet of Things" D. Giusto et al. (eds.), The Internet of Things: 20th Tyrrhenian Workshop on Digital Communications, DOI 10.1007/978-1-4419-1674-7 38, Springer Science+Business Media, LLC 2010.
Rodrigo Roman, et al. "On the Features and Challenges of Security and Privacy in Distributed Internet of Things" Computer Networks 57 (2013) 2266-2279.
Yang Jin-Cui, et al. "Security model and key technologies for the Internet of things" The Journal of China Universities of Posts and Telecommunications, Dec. 2011, 18 (Suppl. 2): 109-112.
Rolf H. Weber, "Internet of Things—New Security and Privacy Challenges" computer law & security review 26 (2010) 23-30.
Jayavardhana Gubbi, et al. "Internet of Things (IoT): A Vision, Architectural Elements, and Future Directions" Future Generation Computer Systems 29 (2013) 1645-1660.
Xian-Yi Chen, "Research on Key Technology and Applications for Internet of Things" 2012 International Conference on Medical Physics and Biomedical Engineering, Physics Procedia 33 (2012) 561-566.
Nathalie Mitton, et al. "From the Internet of Things to the Internet of the Physical World" C. R. Physique 12 (2011) 669-674.
Almundena Alcaide, "Anonymous Authentication for Privacy-Preserving IoT Target-Driven Applications" Computers & Security 37 (2013) 111-123.
Estelle Wagner, et al. "Geometry of Chemical Beam Vapor Deposition System for Efficient Combinatorial Investigations of Thin Oxide Films: Deposited Film Properties versus Precursor Flow Simulations" ACS Comb. Sci. 2016, 18, 154-161.
E. Wagner, et al. "Fabrication of Complex Oxidemicrostructures by Combinatorial Chemical Beam Vapour Deposition through Stencil Masks" Thin Solid Films 586 (2015) 64-69.
International Search Report of the parent PCT application PCT/IB2015/051983 dated Sep. 9, 2015.
Written Opinion of the International Search Authority (WOSA) of the parent PCT application PCT/IB2015/051983 dated Sep. 9, 2015.
Abhijit Biswas, et al. "Advances in Top-Down and Bottom-Up Surface Nanofabrication: Techniques, Applications & Future Prospects" Advances in Colloid and Interface Science 170 (2012) 2-27.
Gordon H. Waller, et al "Nanofabrication of Doped, Complex Oxides" Journal of Vacuum Science & Technology B 30, 011804 (2012); doi: 10.1116/1.3669645.
Darrell G. Schlom, "A Thin Film Approach to Engineering Functionality into Oxides" J. Am. Ceram. Soc., 91; [8] 2429-2454 (2008).
Mark G. Blamire, et al. "The Materials Science of Functional Oxide Thin Films" Adv. Mater. 2009, 21, 3827-3839.
Joerg Heber, et al. "Enter the Oxides" Nature, vol. 459, May 7, 2009.
G.M. Kim, et al. "Fabrication and Application of a Full Wafer Size Micro/Nanostencil for Multiple Length-Scale Surface Patterning" Microelectronic Engineering 67-68 (2003) 609-614.
J. Arcamone, et al. "Full-Wafer Fabrication by Nanostencil Lithography of Micro/Nanomechanical Mass Sensors Monolithically Integrated With CMOS" Nanotechnology 19 (2008) 305302 (13pp).
Nathan C. Lindquist, et al. "Engineering Metallic Nanostructures for Plasmonics and Nanophotonics" Rep. Prog. Phys. 75 (2012) 036501 (61pp).
Luis Guillermo Vallanueva, et al. "Localized Ion Implantation Through Micro/Nanostencil Masks" IEEE Transactions on Nanotechnology, vol. 10, No. 5, Sep. 2011.
Maryna Lishchynska, et al. "Predicting Mask Distortion, Clogging and Pattern Transfer for Stencil Lithography" Microelectronic Engineering 84 (2007) 42-53.
Katrin Sidler, et al. "Compliant Membranes Improve Resolution in Full-Wafer Micro/Nanostencil Lithography" Nanoscale, 2012, 4, 773.
Veronica Savu, et al. "100 mm Dynamic Stencils Pattern Sub-Micrometre Structures" Nanoscale, 2011, 3, 2739.
X.-M Yan, et al. "Parallel Fabrication of Sub-50-nm Uniformly Sized Nanoparticles by Deposition through a Patterned Silicon Nitride Nanostencil" Nano Letters 2005 vol. 5, No. 6, 1129-1134.
Marc A.F. Van Den Boogaart, et al. "Silicon-Supported Membranes for Improved Large-Area and High-Density Micro/Nanostencil Lithography" Journal of Microelectromechanical Systems, vol. 15, No. 6, Dec. 2006.
Marc A.F. Van Den Boogaart et al. "Corrugated Membranes for Improved Pattern Definition with Micro/Nanostencil Lithography" Sensors and Actuators A 130-131 (2006) 568-574.
G. Vallanueva, et al. "Etching of Sub-Micrometer Structures Through Stencil" Microelectronic Engineering 85 (2008) 1010-1014.
B. Viallet, et al. "Stencil-Assisted Reactive Ion Etching for Micro and Nano Patterning" Microelectronic Engineering 85 (2008) 1705-1708.
Cristian-Victor Cojocaru, et al. "Complex Oxide Nanostructures by Pulsed Laser Deposition Through Nanostencils" Appl. Phys. Lett. 86, 183107 (2005); doi: 10.1063/1.1923764.
Paul Te Riele, et al. "Direct Patterning of Complex Oxides by Pulsed Laser Deposition Through Stencils" Journal of Physics: Conference Series 59 (2007) 404-407.
Riad Nechache, et al. "Epitaxial Patterning of $Bi_2FeCrO_6$ Double Perovskite Nanostructures: Multiferroic at Room Temperature" Adv. Mater. 2011, 23, 1724-1729.

(56) References Cited

OTHER PUBLICATIONS

A. Barnabe, et al."Structured ZnO-based contacts Deposited by Non-Reactive rf Magnetron Sputtering on Ultra-Thin SiO2/Si Through a Stencil Mask" Thin Solid Films 518 (2009) 1044-1047.
J. Kohler, et al. "Direct Growth of Nanostructures by Deposition Through an Si3N4 Shadow Mask" Physica E 4 (1999) 196-200.
L Gross, et al. "Magnetologic Devices Fabricated by Nanostencil Lithography" Nanotechnology 21 (2010) 325301 (6pp).
Nenad V. Cvetkovic, et al. "Three-level stencil alignment fabrication of a high-k gate stack organic thin film transistor" vol. 88, Issue 8, Aug. 2011, pp. 2496-2499 (36th International Conference on Micro- and Nano-Engineering (MNE)).
W.T. Tsang "Selective area growth of GaAs and In0.53Ga0.47As epilayer structures by chemical beam epitaxy using silicon shadow masks: A demonstration of the beam nature" Applied Physics Letters 46, 742 (1985); doi: 10.1063/1.95911.
W.T. Tsang, "Selective-Area Epitaxy and Etching by Chemical Beam Epitaxy" Semicond. Sci. Technal. 8 (1993) 10161022.
R.S. Balmer, et al. "Integrated laser/waveguide by shadow-masked selective area epitaxy using chemical beam epitaxy (CBE)" Journal of Crystal Growth 209 (2000) 486}491.
H. Heinecke, et al. "Selective Growth of GaAs in the MOMBE and MOCVD Systems" Journal of Crystal Growth 77 (1986) 303-309.
Dipika Bansal, et al. "Anti-Counterfeit Technologies: A Pharmaceutical Industry Perspective" Sci Pharm. 2013; 81: 1-13.
Ling Li, "Technology Designed to Combat Fakes in the Global Supply Chain" Business Horizons (2013) 56, 167-177.
Mindaugas Andrulevicius, "Methods and Applications of Optical Holography" ISSN 1392-1320 Materials Science (Medžiagotyra). vol. 17, No. 4 2011.
C. Bright, "Vacuum Web Coating of Optically Variable Thin Films for Security Applications" Proceedings of Twelfth International Conference on Vacuum Web Coating Conference (1998) pp. 112-118.
E.D. Tsougenis, et al "Performance Evaluation of Moment-Based Watermarking Methods: A Review" The Journal of Systems and Software 85 (2012) 1864-1884.
Joong Lee, et al. "Invisible Ink Mark Detection in the Visible Spectrum Using Absorption Difference" Forensic Science International 236 (2014) 77-83.
Mojca Friskovec, et al. "Light Fastness and High-Temperature Stability of Thermochromic Printing Inks" Society of Dyers and Colourists, Color. Technol., 129, 214-222 (2013).
Daniela Paunescu, "Reversible DNA Encapsulation in Silica to Produce ROS-Resistant and Heat-Resistant Synthetic DNA 'Fossils'" Nature Protocols, vol. 8 No. 12 (2013) Published online Nov. 7, 2013; doi:10.1038/nprot.2013.154.
Pim Tuyls, "RFID-Tags for Anti-counterfeiting" D. Pointcheval (Ed.): CT-RSA 2006, LNCS 3860, pp. 115-131, 2006.
Will Soutter, "Anti-Counterfeiting Applications for Nanotechnology" URL: http://www.azonano.com/article.aspx?ArticleID=3084.
Charles A. Bishop, "The Use of Vacuum Deposited Coatings for Security Applications" Society of Vacuum Coaters, 43rd Annual Technical Conference Proceedings (2000) ISSN 0737-5921.
Han-Qiao Shi, et al. "Synthesis of Silane Surface Modified Zno Quantum Dots with Ultrastable, Strong and Tunable Luminescence" Chem. Commun., 2011, 47, 11921-11923.
Paul G. Coombs, et al. "Overt and Covert Verification via Magnetic Optical Security Devices" Proc. SPIE vol. 4677.
Yan Cui, et al. "Encoding Molecular Information in Plasmonic Nanostructures for Anti-Counterfeiting Applications" Nanoscale, 2014, 6, 282.
Kyle D. Osberg, et al. "Dispersible Surface-Enhanced Raman Scattering Nanosheets" Adv. Mater. 2012, 24, 6065-6070.
Makoto Naruse, et al. "Optical Security Based on Near-Field Processes at the Nanoscale" J. Opt. 14 (2012) 094002 (13pp).
Sarah Bollanti, et al. "Is this Artwork Original or Is it a Copy? The Answer by a New Anti-Counterfeiting Tag" EAI Speciale II—2012.
Di Lazzaro, et al. "Extreme Ultraviolet Marking System for Anti-Counterfeiting Tags with Adjustable Security Level" Proceedings of SPIE—The International Society for Optical Engineering—Jan. 2012, DOI: 10.1117/12.2010400.
Jun Xu, et al. "Biomimetic Photonic Materials with Tunable Structural Colors" Journal of Colloid and Interface Science 406 (2013) 1-17.
Bora Yoon, et al. "Recent Functional Material Based Approaches to Prevent and Detect Counterfeiting" J. Mater. Chem. C, 2013, 1, 2388.
Cheng-Fu Zheng, et al "Situation and Development of the Material Used for Anti-Counterfeiting" SciRes. (2010) The 7th National Conference on Functional Materials and Applications, 978-1-935068-41-9.
Takashi Metsumura, et al. "Micro Machining for Control of Wettability with Surface Topography" Journal of Materials Processing Technology 212 (2012) 2669-2677.

\* cited by examiner

DEPOSITION PROCESS BASED ON STENCIL MASK AND APPLICATION TO THE FABRICATION OF TAGS SUPPORTING MULTI-FUNCTIONAL TRACEABLE CODES

CROSS REFERENCE TO RELATED APPLICATIONS

The present application is a U.S. national stage application of PCT/IB2015/051983 filed on Mar. 18, 2015 designating the United States, and claims foreign priority to International patent application PCT/IB2014/000802 filed on Mar. 18, 2014, the contents of both documents being herewith incorporated by reference in their entirety.

TECHNICAL FIELD

The invention relates to an equipment for production, a methodology of production and an architecture for a tag. An additive manufacturing method and system for nano and micro 3D-printing of smart and multifunctional thin film materials is disclosed. Single step patterned thin film deposition with a vacuum chemical deposition process in conjunction with stencils masks with micro and nano aperture dimensions to achieve patterned multifunctional oxide thin film deposition is disclosed. Such a process would be applied in particular for one application, a tag device that enables simultaneous authentication, identification, traceability of objects and information encryption of exchanged data related to such objects to which it is applied.

BACKGROUND 1. 3D-printing of thin films with stencil masks

There is a growing demand for micro and nanofabrication technologies, to enable device miniaturization and multi-functionality integration [1] [2], especially for complex oxides, which broad spectrum of optical, electronic, magnetic, etc. properties offers tremendous application opportunities [3] [4] [5]. These materials are usually physically hard and chemically inert which make them difficult to structure by standard technologies including mechanical machining or chemical etching steps, e.g., standard top-down approach, including ion beam structuring, electro beam writing or photo-lithography.

Direct patterned deposition through the use of masks is then a very promising alternative: by maintaining the mask in close contact with the substrate, the structures of the mask are replicated onto the substrate by depositing through its opening. This approach has the advantages of being a single step fabrication method, further allowing parallel processing of a full wafer [6] [7]. To optimize the mask concept, stencil masks, consisting of small thin membranes in which apertures are drilled and which are hold within larger wafer holes, have been developed, allowing pattern resolution down to 50 nm [8].

FIG. 1 presents some of the major problems associated with state of the art technology, which principally are [9] [10]:

a) The blurring, which is a widening of the deposited pattern dimension compared to the stencil aperture size, due to the existing gap between the stencil and the substrate. It generally has two origins: first, a purely geometrical factor and secondly, the formation of an additional halo around the deposit due to diffusion of active species between the mask and substrate at the aperture edges which decompose. Compliant membranes have been developed to reduce efficiently the blurring effect [11] maintaining substrate and mask in close contact, independently of both parallelism. However in the case of the present invention, reduction of the substrate-mask gap is not an absolute priority, as it is exploited in the process.

b) The clogging, which is the aperture size reduction with time due to material deposition on the side walls of the apertures. It is particularly problematic when deposited thickness is of the same order or higher than the aperture size in the case of nano-stencils. It changes the mask opening dimension and the apparent stencil thickness.

A solution as been proposed with the incorporation of micro-heaters in the stencil [12] for physical deposition process. This is no solution for a chemical deposition technique in which reactive species decompose due to thermal heating, and it does not work with non volatile species. Another developed strategy to prevent clogging is to functionalize the stencil with mono-layers that prevent deposition on it [13]. This solution however works poorly in the present invention, the coating being fragile when heated or exposed to organometallic precursor flows under vacuum conditions.

c) The membrane stability: stencils usually consist of 50-500 nm thick Si or SiN membranes, which are very fragile. They are in particular sensitive to the stress induced by material deposition on top of them and thermal effects. Stabilized and corrugated membrane developments enable to reduce problems associated with this effect [14; 15].

FIG. 1 describes deviation from ideal case of the deposition process using stencil mask. In the idealized case (image a), a punctual source of reactive species contributing to the deposit (SE), is situated at a large distance, h, from the mask (SM), of infinitely small thickness, that is in close contact to the substrate (SU), with a small gap g close to 0, but non null. The mask aperture of dimension dO is replicated with same dimensions leading to deposition (D) on the substrate.

In the real case, the emission source has a non-zero dimension (dE). The gap g is not zero, so due to geometric factors, the aperture of dimension dO results in a deposit of dimension dGB due to geometrical factors. Additionally, some reactive species may diffuse in the gap between mask and substrate and realize an additional halo deposit of dimension dGH around the main deposit. The enlargement of the deposit dimension with respect to mask aperture dimension is called blurring (image b).

In addition, deposition may take place on the mask top and side (image c), leading to clogging, due a deposit $D_m$ that affects the aperture dimension (reduced from dO to dOm) and mask thickness (increased from t to tm).

The deposition of material on the mask, and more specifically on the stencil membranes within the mask, is the main problem that the present invention proposes to solve, to ensure better stencil mask re-usability and longer mask life time.

Stencil deposition has mainly been used for metal deposition by evaporation, but stencil principle can also be applied to material etching [16] [17] or material local modification, for instance by ion implantation [9]). Oxides have also been deposited selectively through stencil masks, by room temperature PLD [18], high temperature PLD [19] [20], non reactive magnetron sputtering [21] and MBE [22]. The use of such a physical vapour deposition (PVD) technique with stencil masks is referred to as stencil lithography, and today, first devices based on such techniques have been demonstrated [7] [23] [24].

Considering chemical vapour deposition techniques, Chemical Beam Epitaxy (CBE) and related techniques (Metalorganic Molecular Beam Epitaxy (MOMBE), Gas Source Molecular Beam Epitaxy (GSME)) have been demonstrated for more than 25 years of being highly compatible with the use of shadow mask to realize selective deposition [25] [26]. Micrometric III-V structures have been deposited and their application to integrated laser/waveguide applications [27] have for instance been shown. Compared to the PVD methods previously quoted, Chemical Beam Epitaxy offers the advantage that the chemical reaction responsible of the deposition can be controlled by precursor flow and temperature to induce selective area deposition [28].

2. Tags to Fight Anti-Counterfeiting and Ensure Identification and Traceability 2.1 Description of the Problem 2.1.1—Fighting Anti-Counterfeiting and Tracing Products Forgery and counterfeiting are problematic that organised societies have had to fight since the very beginning. Everyone is aware of counterfeited products such as luxury goods, e.g. watches, handbags, jewels, softwares, DVDs, CDs, etc., but the plague also extends to new products such as pharmaceuticals or toys, where the problem is no longer only economical, but also impacting people's health or even putting their lives at risk. Today, it is estimated that counterfeit goods are sold worldwide annually for more than $600 billion and that 10% of all sold medicines are counterfeit.

2.1.2—Securing Data and Tracing Information

As our society evolves faster and faster, mainly thanks to a plethora of new emerging technologies, new solutions and services blossom, leading to new needs that could not be anticipated even a few years ago. A main topic in this direction is the emergence of the security related to improved global communication (ICT) facilities. To protect both physical and virtual identities, either at individual or collective levels, new behaviours and organisational rules emerge, demanding fast adaptation to systems of increasing complexity. Among other priorities of ICT, we can mention passwords that are needed to securely connect to everything (cyber-security), starting from close range objects like our PCs, to virtual databases (e-banking, etc.) or social platforms (Facebook, LinkedIn, games, etc. . . ), up to very complex collaborative clouds or networks. Today, as existing solutions are rapidly getting obsolete, more and more elaborated solutions are proposed to protect ourselves from highly invasive and aggressive intrusions coming either from next door neighbours or crossing the planet. The problem is growing to epic proportions with topics such as big/small data and the "internet of things" where a huge mass of information will have to be exchanged in a secure, rapid and efficient way. The societal plague associated with the lack of security of such systems (with identity hacking, frauds, phishing scam, intrusion into privacy etc. . . ) is getting person oriented and carries a huge emotional impact, involving everybody without any discrimination of age, sex and educational level. There is today a strong need to identify in a secure way a really huge number of objects/persons/concepts and no assessed solution is presently at hand.

2.2 Foreseen Solutions for the Problem 2.2.1—Taqs/Etiquettes/Labels Concept and Their Requirements To fight against anti-counterfeiting, two types of object labels are developed [29, 30]:
- "authentication" labels, which confirm in a safe way the nature of the product, the brand logo, etc.
- "track and trace" labels which carry additional specific information such as serial number, etc. and allow an object traceability.

Usually, the technologies used to realize these labels are divided into 3 groups:
- "overt technology": authentication areas on the product are visible, they can be checked by eyes. These include for instance holograms [31], OVDs [32] (optical variable devices, which are marks that change colours depending on the direction they are looked at), watermarks [33] (which are images created by variation of paper thickness), colour or fluorescent ink marks, bar codes, etc. . .
- "covert technology": authentication areas on the product are hidden, they can only be checked with an adapted reader. They include for instance UV sensitive, IR sensitive or thermochromics inks [34, 35], taggants (fluorescent or magnetic nanoparticles, etc. . ),
- "machine readable technology" : authentication areas on the product require sophisticated equipment to be identified. These include synthetic ADN marking [36] biological or chemical nanoparticles inclusion, etc . . . They also include sophisticated "Track and Trace technologies" such as radiofrequency identification (RFID) [37] tags and Electronic Product Codes (EPCs).

Any truly effective modern anti-counterfeit system should display three elements: authentication, identification and track/trace capabilities. For that, the label should fulfil 4 obligations: (1) be difficult to duplicate or forge, (2) have a part easy to identify visually without any special equipment, (3) being difficult to remove from a product, to replace or re-use on another product and (4) have an invisible track and trace fingerprint, machine readable, containing an important amount of information. In the case of remote authentication, a cryptographic solution should also be required to secure the exchanged information.

A further difficulty to overcome for an efficient technology is an economic one [38]: should it provide a product a totally unique, with an irreproducible signature, etc., there is no hope for its development if the tag price is higher than the likely loss of income through counterfeiting.

2.3—State of the Art—Existing Solutions 2.3.1 Solutions for Authentication/Anti-Counterfeiting Several techniques exist and are used to achieve authentication, security and anti-forgery solutions:
- biological or chemical identifiers: isotopes, molecules-ADN, fluorescent, rare earth, nano-structures, chemical composition;
- electronic devices: RFID, biometrics, fingerprints, electrical signatures (PKI or DRM);
- optical: holograms, security inks, nano pigments, nano-capsules, magnetic nano-particles, polymers micro-tagging, radiography;
- mechanical/chemical/laser machining: marks, embossing, lapping, machining, etching, thermal deformation, micro-nano structuring; or
- coatings.

On one hand, naked eye reading is a quite subjective and time consuming solution at large scale and overt technology labels contain a very limited amount of information. On the over hand, covert or machine readable technologies require expensive/poor-mobility readers With regards to the production techniques, printing methods are the most common. Two different printing approaches are today available, either based on sequential (or serial) printing or based on parallel printing techniques:

the first methods of serial printing usually suffer from low resolution (thus containing low amount of information) or are time consuming and poorly cost efficient if higher resolution (with micro or nano dots resolution) is targeted (like for Plixel Printing). The time required to print a highly resolved etiquette/tag/label is such that this method will never be suitable to address efficiently huge mass production of high security/high information density. This is an intrinsic limit of such serial printing technologies. With regards to the high-resolution printers, when they get affordable and readily available on the market, the security will just get obsolete rapidly;

the second methods of parallel printing (printing simultaneously all the surface) could allow cost effective mass production and with high resolution. However, the matrix production cost is usually very high and all the codes are identical, allowing neither flexibility nor variations on the tag (which is actually where the traceability and possibly enhanced security lays). Again, if the core technology is cracked (the matrix is duplicated), all the security associated with this solution is gone.

It is believed that a cost-effective and secure mass production that is not getting rapidly obsolete because of forgery is not available in prior art, with standard printing methods as demonstrated by constantly evolving adoption of novel solutions for banknotes and similar objects.

For these reasons, additional security for anti-counterfeiting or anti-forgery is provided through inks (main player is SICPA). Main examples are on banknotes or other secured documents. Usually, there are two scales of effects: macro-scale with a printed message (names, pictures, serial numbers, . . . ) where information is given by some order in the structure and random micro-nano scale effects that serve as an anti-forgery mechanism for the ink itself. In the first case, a pattern can be seen by naked eye, but does not provide any security mechanism. In the second case, random structures, that can be identified only through the use of a special dedicated reader, do not usually contain any information, but provide security. Among the additives in inks, we can quote fluorescent (KR20110126885) or other optical effects induced by micro or nano particles (KR20110006836, JP2010237448, EP1882176, CN1940013, DE102005019980, US2005112360, GB1536192), embedded/dispersed/printed into markers or tags/etiquettes, (with companies such as TraceLess or Microtrace) etc. . . Printing methods with special inks make an intensive use of such additives, the inks providing optical functionalities or other functionalities like electrical conductivity (CN1869134, CN1917097, WO2008053702) to the printed pattern. We can list, among others, NanoIMG (US2010050901) with embedded micro and nanostructures in an invisible unique code, Nanum with its Magnetic Ink Character Recognition (MICR) inkjet ink technology, or DNA barcodes from UATEC University in Portugal or Tracetag that exploits specific chemical reactivity of embedded molecules in the barcode. When the ink secret composition is cracked, however, all the documents based on the technology can be forged. Another drawback is related to recycling of such tags as mentioned in previous work (JPS62206695, JP2009276564) that very often contain rare or toxic elements.

As an alternative, we can quote ink-less printing methods such as laser writing or marking on bulk materials like ceramics (GB2284404) or laser modifying the surface properties of materials to achieve optical effects. Lasers are mainly proposed to achieve a marking effect without containing any security out of the possible complex substrate material composition and its patterning. Enhanced effects with a laser for improved security, also make use of additional polymer films (CN101143958) or multilayer films (JP2006007592) that are modified by laser irradiation in a very difficult to counterfeit way. Nevertheless, again these techniques suffer from most of the same intrinsic limits of printing methods with inks.

Hot embossing or other mechanical/thermal deformation techniques (such as proposed by Tesa or Scribos) of a tag or directly of the object itself is also extensively used. Several holograms, consisting in engraved/embedded micro or nano-structures with optical effects on micro-regions, can be combined offering an appreciated resistance to forgery. Among others we can mention those developed by Hologram Industry based on interference micro lithography or digital holography, which are also used in a wide number of applications.

Further solutions are based on identifying already existing defects in the bulk material matrix/texture of a tag or object itself. This is the solution proposed by Proof-tag or Ingenia Technology with a laser surface identification technique. These methods are, however, very sensitive to the degradation of the object and identification of patterns can be quite time consuming. Furthermore, they require complex and time-consuming reader solutions.

Patterned thin films are also been proposed (CN1547180) using for example $TiO_2$ composites or patterned polymer films (TW201225026) using wetting and optical properties effect combination. Several other inventions are disclosed for polymers or easily etchable or machined materials such as resins (US2008248266, JPH04118690), but with limited lifetime due to poor mechanical and chemical stability of the materials.

Iridescent thin films have also already been proposed (JP2005085094), but only to achieve an optical effect as a function of the viewing angle. Another invention (KR20040045270) discloses different materials to achieve monochromatic wavelength contrast due to different optical thicknesses. Materials with different refractive indexes are provided to achieve such an effect, leading either to limited effects or to very expensive assembly manufacturing.

Finally, multi-region or multi-functional tags have also been proposed (CN201025567, CN201020901), consisting in a vertical assembly of different solutions. These solutions are however quite expensive and complex to realize.

With regards to the idea of combining traceability and security, a solution called "TAG" exploits two components (an anti-counterfeiting tag and a QR code) that are combined in a single solution. On one hand, such solution claims that the copper wires cannot be replicated, but the set-up is relatively simple and for sure cannot guarantee a huge number of different combinations. On the other hand, the QR contains a very limited amount of information (black and white dots of low resolution).

Thin film vacuum deposition technologies have been recognized for a long time as efficient technologies to create security or anti-counterfeiting labels [39].

Among these, we may quote:
luminescent quantum dots [40];
overt optical label combined with magnetic covert label [41];

covert plasmonic security labels based on Ag nanowire structures and their polarization dependent surface-enhanced Raman scattering (SERS) imaging [42];

over identification by Surface-Enhanced Raman Scattering [43];

nano-optics and near field optics [44];

invisible marks: patterns on LiF crystals by EUV [45] [46];

photonique nanostructures [47];

use of multifunctional material [48];

the use of non toxic or dangerous materials is highly preferable [49];

Concerning the reading tag technologies, we may quote:

angle dispersive X-ray diffraction (X-ray detection in packaging (patent No U.S. Pat. No. 7,756,248 from Panalytical B. V., 2009);

Raman scattering (Erasable taggant distribution channel validation method and system, patent U.S. Pat. No. 7,875,457 B2 from Axsun Technologies, 2004);

wettability [50];

2.3.2 Solutions for Identification/Traceability

Two standard general techniques are used:

bar codes: a barcode is a machine-readable optical label that contains information about the item to which it is attached. They replace an alpha numeric code by a geometric pattern code.

Referring to FIG. 9, bar codes include linear barcodes Lmade up of lines and spaces of various widths that create specific patterns, such as for instance the UPC, Universal Product Code) or 2D bar codes (composed of 2D geometrical patterns, such as the trademark QR-codes (Quick response code) or the Data matrix code, which is free of use)

The advantage of these codes are easy and cheap printers/readers with a huge availability to the average population with readers as simple as a Smartphone. These solutions can provide identification of 1 object out a group of a million units up to roughly one billion units. Higher pattern resolution is required to increase information density and address larger groups of objects. Furthermore, no security is tied to these codes that can thus be easily copied and reproduced or moved to different objects.

The bar codes ease of reading is also their main weakness as anyone can forge or counterfeit them. Furthermore, such marks contain only very limited amount of information and when large numbers of objects are to be tracked (over 1 billion), the system rapidly gets to its limits. One solution is to further increase dot resolution or to add colour (JPS62206695, CN2448723), but this still yields intrinsic limits to security and anti-forgery issues.

RFID (radio frequency identification)

RFID tags contain electronically stored information that is read by wireless non contact readers. They are either powered, behaving as local power source and operate up to few hundred meters, or non powered, emitting either microwaves or ultra-high frequency radio waves when exposed to magnetic fields (by electromagnetic induction).

RFID Tags [51] or electronic tags (WO2012053716, US2008149731) are nowadays employed in a very broad range of applications, to track goods and products, objects, such as baggage, accesses, for instance to public transportation, people, for instance in hospitals, animals, etc. . . These RFID tags offer high reliability without contact reading method, but readers and codes themselves are getting quite expensive and with a poor mobility. The advantage of such tags is remote reading without mechanical or visual contact. However, these tags are quite expensive (15 cts for passive tags, 25 dollars for active tags [52]) and usually require bulky readers or energy supply. Furthermore, a huge quantity of tags (above 1'000) within a reader will lead to confusion and misreading. As a further disadvantage we can also quote that RFID, or other purely electronic systems, are usually providing poor security as tags can be moved from one product to another easily. They also contain polluting elements such as chrome in appreciable quantities. Finally, being a remote reading process, tracking of people wearing such tags on their products is a main limit to this technology as it disregards any privacy policy. Companies involved in such a field are, for example, Secure RF or Tagsys.

Another solution is the Contact Memory Botton, electronic component used by the US army and developed by the company TITANOX Industrie.

Further electronics popular solutions range from biometric identification (fingerprints, eye pattern, face feature recognition, etc. . .). However, these solutions cannot be applied to objects.

2.3.2. Data Security

The next societal evolution in ICT will be related to traceability and connection of objects with their relative information exchanged in a secured way and this constitutes the field of the "Internet of Things" or "Internet of Everything". There, huge quantities of data (Big Data or Small Data) related or emitted by practically any kind of objects will require a protocol merging the security and traceability covering both the PCs and the objects interconnected as well as an encrypted information to provide remote authentication.

It appears obvious today that constantly innovating solutions have to be found to secure Big Data [53, 54, 55, 56, 57, 58]. Some solutions are proposed in [59, 60, 61], including again RFID.

When we are speaking about security today, the first thing that comes to the mind, very often even before house or streets security, is Cyber-security and passwords to protect our virtual life. Several solutions are today available, but most are based on software-based solutions to encrypt information that can, however, be remotely hacked. Password-based systems furthermore have the weakness than when the password is cracked unlimited access is guaranteed. Furthermore, the over-increasing number of required passwords leads to poorly safe methodology to generate and store such passwords at individual level. More secure systems, involving hardware for PW generation, rely on additional manual time consuming endless password checks that are a real hurdle to the end-user and cannot manage a huge number of secured transactions in a timely manner. Actually, today this is the only secured procedure to avoid automatic cracking of codes by computers.

SUMMARY OF INVENTION

The present disclosed invention uses the combination of stencil-assisted deposition with a vacuum Chemical Vapour Deposition technique, namely Chemical Beam Vapour Deposition. This technique is related to Chemical Beam Epitaxy technologies (CBE), a merging of the parent techniques, namely Chemical Vapour Deposition (CVD) and Molecular Beam Epitaxy (MBE). It is a vapour phase deposition technique operated under vacuum conditions ($<10^{-5}$ mbar) in which chemical precursors reach the substrate with ballistic transport from sources and decompose at the heated substrate surface by a chemical reaction. Usually, precursor molecules are transported without any carrier gas and decompose without any reactive gas, although some additional gas can be added.

The inventive process is based on selective deposition to achieve deposition conditions in which deposition takes place selectively on the substrate and not on the stencil mask (or more generally not on the mask), to solve the problems of clogging and stencil re-usability.

Moreover, taking advantage of a plurality of precursors sources geometrically distributed around the substrate, it is possible to obtain complex thin film 3-dimensional shapes of overlapping or non overlapping deposits through stencil openings, playing with the opening dimensions, the stencil-substrate separating gap dimensions, and the relative geometric position of precursor sources and stencil openings.

In order to achieve the above described combination, the invention provides the use of a mask, or a stencil mask, in combination with chemical precursors in vacuum with line of sight ballistic transport to deposit thin film materials, in preference of multifunctional materials. With the combination of such elements, high resolution patterns can be achieved, deposition on the mask can be avoided and complex combination (controlled gradients) of elements and properties within a structure can be produced with micrometric and sub-micrometric resolution.

As a further innovation, the described invention disclose a method to achieve a wide variety of different thin film structures and properties within the same deposition process on the same substrate in order to achieve a unique cost-effective mass production of coatings/devices with unique, all different properties. The method is based on chemical composition variation as well as the control in size and shape of 3-dimensional thin film structures.

The flexibility and tuning of the method are based:
on one side, on the possibility to vary the number, shape, dimension and position of mask apertures, as well as the gap between mask and substrate, and the position of the mask aperture with respect to the precursor sources.
on the other hand, with a same mask aperture, on the chemical precursor flow modulation obtained from a plurality of precursor sources that can be independently switched at will on and off, and that can emit different precursors for the different elements.

Concerning the application, the invention provides a tag with traceability, authentication, anti-counterfeiting and encrypting coding, all in one solution, with related production methodology and tools.

The invented tag will be referred to as MFT-CODE (Multi-Functional Traceable Code).

In a first aspect the invention provides a chemical gas phase deposition process comprising steps of providing a high vacuum chamber, and inside the high vacuum chamber: positioning a substrate surface; positioning a mask parallel to the substrate surface, whereby the mask comprises one or more openings; adjusting a gap of determined dimension between the substrate surface and the mask; and orienting a plurality of chemical precursor beams of at least one precursor species towards the mask with line of sight propagation, each of the plurality of chemical precursor beams being emitted from an independent punctual source, and molecules of the chemical precursor pass through the one or more mask openings to impinge onto the substrate surface for deposition thereon. At least a part of the chemical precursor molecules decompose on the substrate surface at a decomposition temperature. The process further comprises adjusting a temperature of the substrate surface greater or equal to the chemical precursor molecule decomposition temperature, thereby remaining greater than a mask temperature, and maintaining the mask temperature below the decomposition temperature, thereby causing a decomposition of the chemical precursor and a growth of a film on the substrate surface, but not on the mask; and heating the substrate surface using a heating device.

In a preferred embodiment of the process the substrate surface is positioned between the heating device and the mask, and the mask temperature ($T_2$) at equilibrium is a function of the temperature of the substrate surface ($T_1$), the mask temperature being achieved mainly by radiant heat exchange from the substrate surface since the gap inhibits heat transfer by conduction and the high vacuum reduces heat exchange by convection.

In a further preferred embodiment the substrate temperature is achieved at least by rapid thermal annealing.

In a further preferred embodiment the substrate temperature is achieved by short laser pulses irradiation and/or exploiting different wavelength absorption of substrate and mask material.

In a further preferred embodiment the step of orienting the plurality of chemical precursor beams comprises adjusting for at least two of the plurality of chemical precursor beams respective angular directions that differ amongst each other, thereby creating at least two different chemical beams that pass simultaneously through the one or more openings, and causing a co-deposition of different either separated or superimposed structures on the substrate surface.

In a further preferred embodiment the process further comprises modulating a first of the two of the plurality of chemical precursor beams and modulating a second of the two of the plurality of chemical precursor beams to control for the co-deposition of different structures either one or several of the following: a thickness of the different structures, a chemical composition of the different structures, a chemical composition gradient of the different structures.

In a further preferred embodiment the process further comprises adding at least a first surface between the substrate surface and the mask or between the mask and the chemical precursor sources, consisting in a thin foil with openings corresponding to mask openings.

In a further preferred embodiment the process further comprises providing a flow of a different chemical precursor, whereby the different chemical precursor differs from any chemical precursor of the plurality of chemical precursor beams, whereby the different chemical precursor has a higher decomposition temperature in comparison to a main precursor of the plurality of chemical precursors used to achieve a thin film, by blowing the further flow in a direction substantially tangential to the mask, thereby minimizing the impinging rate of the further flow on the substrate, but optimising the impinging rate of the further flow on the mask surface, the different chemical precursor being used to inhibit decomposition of the main precursor on the mask, but not on the substrate.

In a further preferred embodiment a thickness of the film deposited on the substrate surface is adjusted by setting a determined ratio between a dimension of a gap separating the mask and the substrate surface, and a mask-source distance separating at least one of the punctual sources from the mask.

In a further preferred embodiment patterns of the film are shaped and sized by modulating the determined distances ratio between substrate to mask and mask to source during the deposition.

In a further preferred embodiment the distance of the mask to the substrate is smaller than the distance of the mask to the precursor sources.

In a further preferred embodiment the distance of the mask to the substrate is smaller or of the same order of magnitude than the distance between the holes in the mask.

In a further preferred embodiment the process further comprises a post deposition process of laser irradiation on at least a part of the film formed on the substrate surface thereby enabling to selectively pattern at morphological level.

In a further preferred embodiment the process further comprises a post deposition process of laser irradiation on at least a part of the film formed on the substrate thereby enabling to selectively pattern at the crystalline phase level (for materials such as $TiO_2$) or at further intrinsic material properties (for example holographic data storage for materials such as $LiNbO_3$).

In a further preferred embodiment the step of orienting the plurality of chemical precursor beams is configured to produce non uniform flows over the substrate surface, whereby chemical precursor molecule impinging rates are graded and result in thickness and/or composition gradients, to achieve all different structure properties across the substrate.

In a further preferred embodiment the process further comprises varying chemical precursor molecules impinging angles as a function of the position on the substrate and gap to achieve all different thin film structure properties all over the substrate.

In a further preferred embodiment the process further comprises varying the deposited material, its properties and patterns without changing the mask(s), but one or more of the following parameters: flow intensities of the chemical precursor(s), number and position of the sources used by turning any one of the sources on or off, and the substrate-mask gap distance to achieve all different structure properties across the substrate and obtain a variability of conditions without changing the mask(s).

In a further preferred embodiment the process further comprises obtaining entangled properties in each single structure resulting from chemical composition, size, shape and material interface combinations, and most of all, material thin film growth process strongly impacting such thin film/structures properties.

In a second aspect the invention provides a tag device comprising at least a multi-functional material thin film that inherently provides a plurality of independent physical quantities, each of which is patterned to the intent of being measured by one or more corresponding measuring techniques that are not predetermined and could be selected by users (ultra-covert functionality).

In a further preferred embodiment the tag device further comprises a plurality of structures, each of the plurality of structures being a part of the multi-functional material thin film, and each of the plurality of structures exhibiting a specific signal in response to a measurement technique dedicated to the structure.

In a further preferred embodiment of the tag device each of the plurality of independent physical quantities has an overall outer size in the range of nanometres to centimetres, with preferably different scales achieved on the same tag.

In a further preferred embodiment of the tag device the plurality of independent physical quantities are achieved in a single production step as described in the deposition process.

In a third aspect, the invention provides a tag device comprising a partition arranged with a plurality of regions that each exhibit a measurable quantity of different nature that can be measured by different readers.

In a fourth aspect, the invention provides a tag device containing a plurality of different structures arranged for traceability, anti-forgery and cryptography, each of the structures comprising a plurality of 3D dots (or any other geometrical 3D structures) of different thickness and sizes, whereby each of the plurality of 3D dots displays a plurality of varying properties, among which for example colours, reflectivity behaviour as a function of wavelength, electrical conductivity, magnetic properties, non linear optic properties, piezoelectricity, electro-optic properties, depending on a chemical composition, size and shape effects at micro or nanometre level and interface combinations (hetero-structures). Authentication with structures properties relations are regulated by process determined algorithms of a process used to produce the structures or by direct matching of the properties of two identical tags, one used to trace and authentication and one used as a reference in a database.

In a fifth aspect, the invention provides a use of the tag in an authentication process involving a step of reading the tag by naked eye or an optical reader taken from the group comprising at least a dvd player, a blue ray player, a Smartphone, a digital camera, whereby the tag is illuminated with a plurality of different monochromatic illumination wavelengths or with white light filtered by at least one filter, and/or through measurement with an Ohm-meter, or from more sophisticated instruments such as spectral reflectometre, spectral Ellipsometre, micro-Raman, AFM, STM, etc. . . each of the reading and measurement providing a different/complementary lecture/output.

In a sixth aspect, the invention provides a tag comprising a combination of different regions achieved by multifunctional patterned materials as previously described, whereby one of the different region has overt authentication features, one region has covert anti-counterfeiting features, one region has forensic anti-counterfeiting feature (such as sensors functionalities), a region has power generation functionality, further regions have different functionalities related to material enabled functionalities, one or more regions have ultra-covert authentication features enabled by a plurality of possible reading methods.

In a seventh aspect, the invention provides a tag displaying a partition of regions, one of the regions displaying uniform or graded properties taken amongst the list comprising at least thickness, colour, electrical conductivity, the properties being those of a material that are further modifiable by light irradiation or a chemical process to achieve a logo, a serial number or any distinctive additional feature that will contribute to enhance traceability, anti-forgery or cryptographic functionalities.

In an eighth aspect, the invention provides a tag divided in a plurality of regions each containing different structures/information at various scales , whereby each of the plurality of regions may display different functional properties possibly intended to be checked by a specific/different measuring/reading device and to be attributed to a different specific type of customer. More than 1 code up to several millions of codes for smallest features can be embedded in a given region. The MFT-Code should contain in preference a macroscopic region that can be identified by naked eye with, one that can be identified by a highly available reader (smart-phone), and one or more further regions with a higher security level and a huger amount of (encrypted) information.

In a further preferred embodiment of the tag, the various scales are from a few mm to a few cm in a region 1, from 10 to few hundreds of microns in a region 2, from 1 to 10 microns in a region 3, and from nano-metric to sub-micrometric scale in a region 4.

In a further preferred embodiment of the tag there are more than 4 regions.

In a further preferred embodiment of the tag, the plurality of regions are intended for a reading of several multifunctional properties, even within a same region, and may be selectively attributed to different customers through different reading techniques.

In a further preferred embodiment of the tag more than 1 code up to several millions of codes for smallest features may be embedded in a given region.

In a further preferred embodiment of the tag, an MFT-Code may comprise a macroscopic region intended to be identified by naked eye with, one that can be identified by a highly available reader (smart-phone), and one or more further regions with a higher security level and a huger amount of (encrypted) information.

In a ninth aspect, the invention provides a book-cipher-like encrypting method based on material properties mapping, and comprising at least using at least two identical tags, one of which used as key-code, the security of the solutions being enhanced by the possibility to have a plurality of different and independent codes available in the tag and by the fact that the at least two identical tags are unique and cannot be forged.

In a tenth aspect, the invention provides a packaging for a tag, whereby the tag is provided on very thin metallic foils to enable a sealing solution for a container that will be torn apart when the container is open (tamper-evidence solution).

In a further preferred embodiment of the packaging, the tag is embedded in polymer foils thereby enabling a more robust solution or directly melted into a material such as a glass bottle or different other transparent media as the tag multifunctional thin film material may withstand high temperatures and the thin film material has a high refractive index.

In a further preferred embodiment of the packaging, a tag deposition process is CMOS compatible and/or standard microelectronics processes compatible and may be achieved directly onto a device such as a CMOS camera, a sensor or any other integrated electronic/photonic/etc. . . . circuit with direct vertical/monolithic integration to achieve embedded cyber-security functionality and connection to the internet with cryptography protocols.

BRIEF DESCRIPTION OF THE FIGURES

The invention will be better understood through the detailed description of example embodiments of the invention and in light of the accompanying figures, wherein FIG. 1 contains an illustration of a deviation of deposition through stencil mask from the ideal case, due to blurring and clogging.

Same reference numbers will be used throughout the description to designate same of similar features.

DETAILED DESCRIPTION OF EXAMPLE EMBODIMENTS OF THE INVENTION

Figure 3:
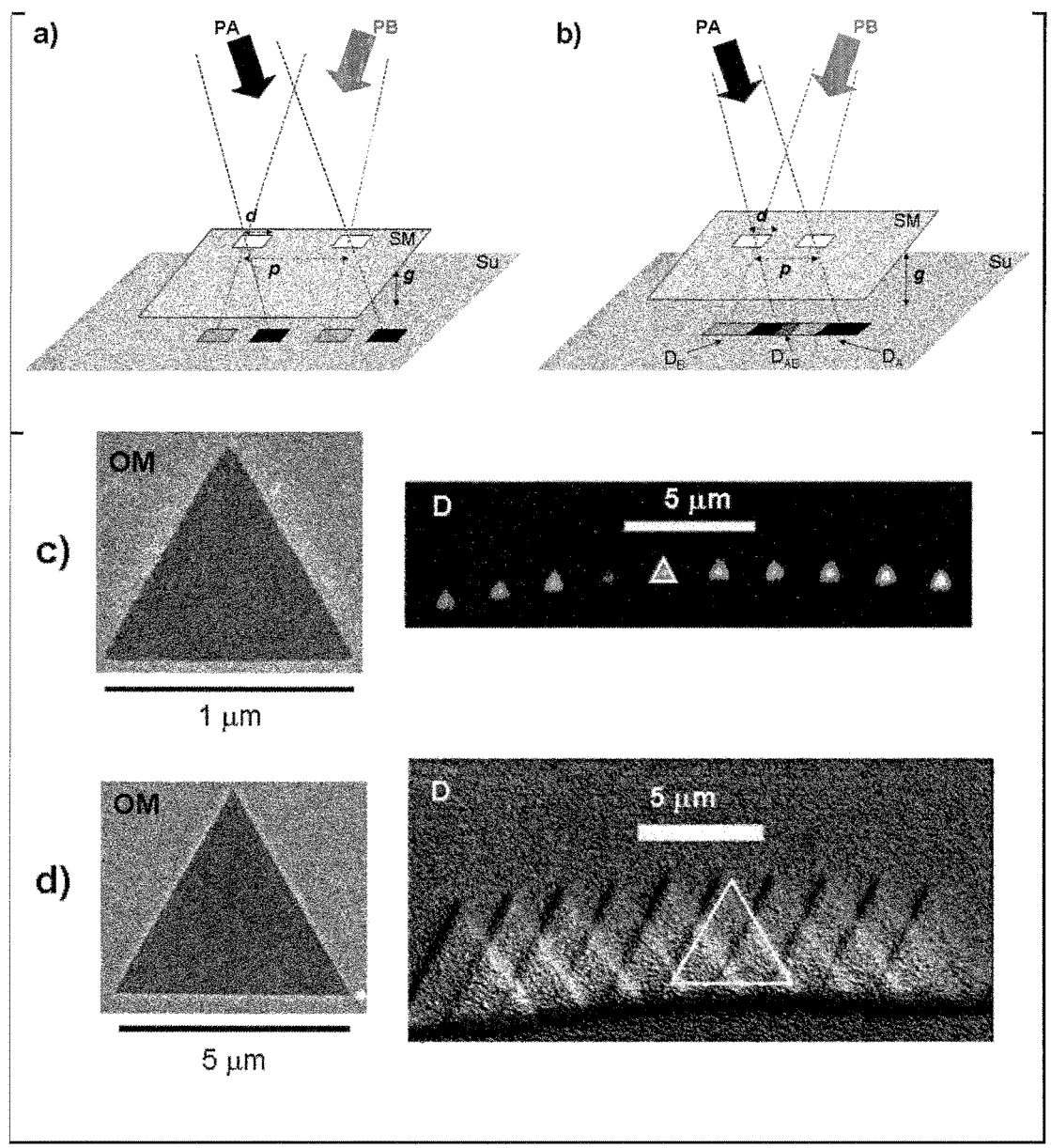
FIG. 3 shows in a) and b) deposition from two different precursor sources resulting either in separated or superimposed flows leading to either separated or superimposed deposit.; an in c) and d) example of deposits superimposed or not obtained by depositing through a single aperture from 10 neighbouring punctual sources.

FIG. 3 describes the effect of the mask/substrate-to-be-covered gap to deposit 3D structures. Schemas a) and b) shows the deposit from two punctual sources PA and PB through a mask (SM) on a substrate Su through two different openings. Depending on the distance p between apertures, on dimension apertures d and on mask-subtrate gap g, the flows from the two sources can either remain separated (image a) or partially superimpose (image b) or almost fully superimpose. If precursors for different elements are used in the two sources, such deposition process allows obtaining in a single step separated deposits of different elements with different thicknesses, or co-deposition of different elements with varying chemical composition and thickness within the deposit or thin film structure.

Pictures c) and d) shows $TiO_2$ deposit AFM profiles for the deposition from 10 neighbouring Ti precursor sources through a single triangular deposit for a substrate mask gap g of about 80 µm and a source plane-substrate distance of about 15 cm. For a 1 µm triangular opening OM (left image), the deposits from the 10 different sources are separated (image c) while for a 5 µm triangular opening, the deposits from the 10 different sources partially overlap. The dimension of the aperture is reported as a white line triangle on the deposit profile for comparison.

Figure 2:
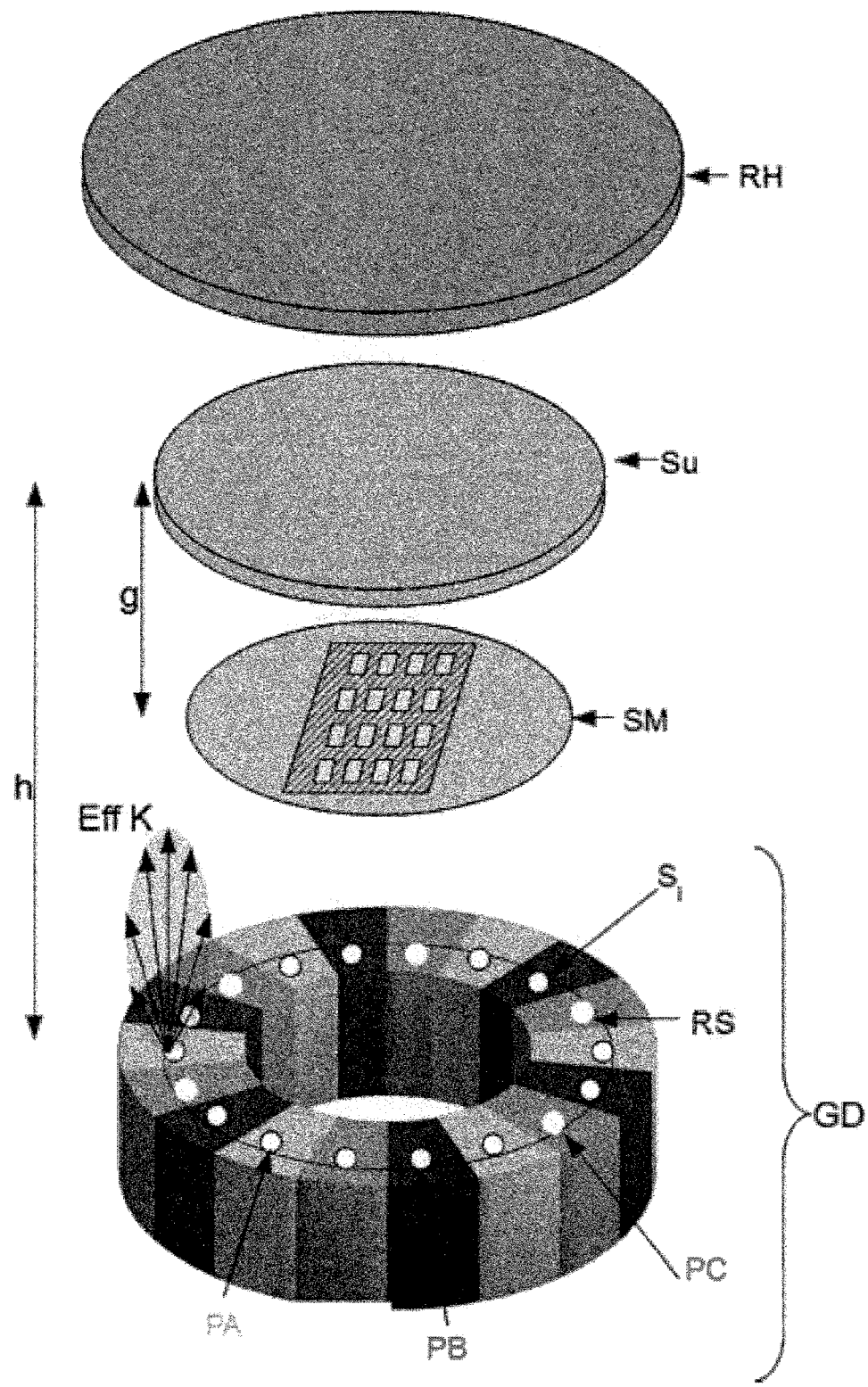
FIG. 2 contains a schematic disposition within a vacuum chamber of a substrate heater, a substrate, a mask and a precursor flow distribution unit.

FIG. 2 describes the set-up assembly and the relative disposition of the various components. Within a vacuum-pumped chamber, a radiative substrate heater (RH), a substrate to be deposited on (Su), a (stencil) mask (SM) and a precursor flow distribution system (GD). The precursor flow distribution system is represented here for 3 precursors (labelled PA, PB and PC) and precursor beams are emitted with Knudsen effusion (symbolized as EffK) from a plurality of precursor sources, S1. Here the sources are represented alternating precursors and disposed on a ring, but any over configuration is acceptable depending on the targeted result. The sources have a small diameter in comparison to the distance h (they are considered as point sources). The gap-mask distance g is small in comparison to the distance precursor source-substrate h. The sources can accommodate different chemical precursor (other number of precursors than the 3 represented here can be used) and can be turned on or off independently.

Figure 4:
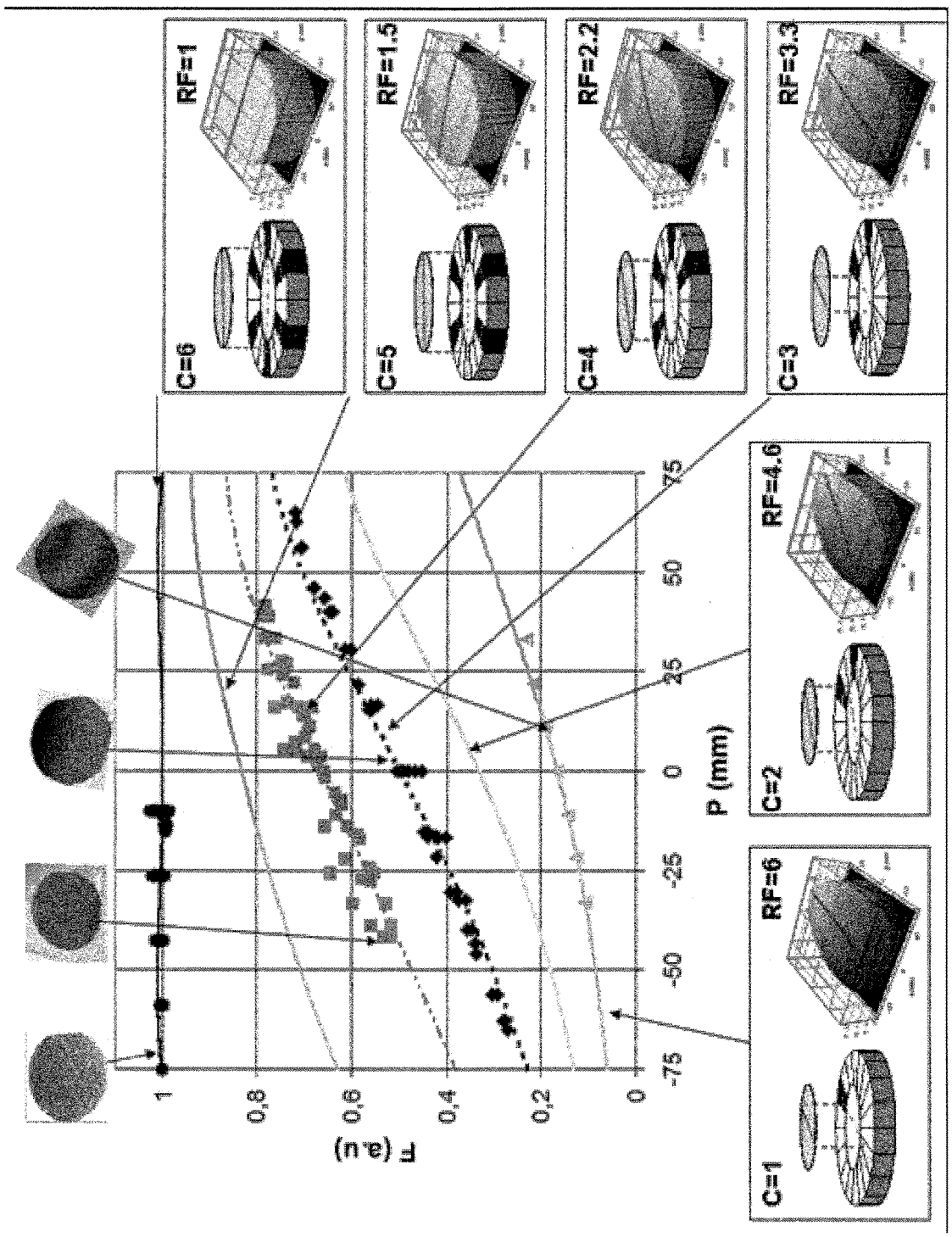
FIG. 4 illustrates different chemical precursor molecule flows as a function of the number of active sources, resulting in different impinging rate gradients and graded growth rates on the substrate.

FIG. 4 describes, for the example, the system depicted in FIG. 2 for which 18 groups of sources are used alternating for 3 different precursors. Some configurations to achieve chemical precursor flow gradients across the whole substrate simply by shutting on and off some of the sources for a given precursor are reported. Very different distributions can be achieved and only some configurations are reported as examples. The number of active source group, C, is varied from 1 to 6, resulting in different flow gradients with a varied maximal flow ratio, RF, along the major gradient diameter (highlighted in the small 3D-views in each case). If all the six source groups for a given species are turned on, a homogeneous deposition results. The main graphic shows the modelled precursor flow (line) as a function of the position along the major flow gradient diameter on the substrate, with additionally, some scaled deposit thickness measurements (obtained experimentally in this configuration. Some photographs of these deposited wafers are shown at the top of the picture).

Figure 5:
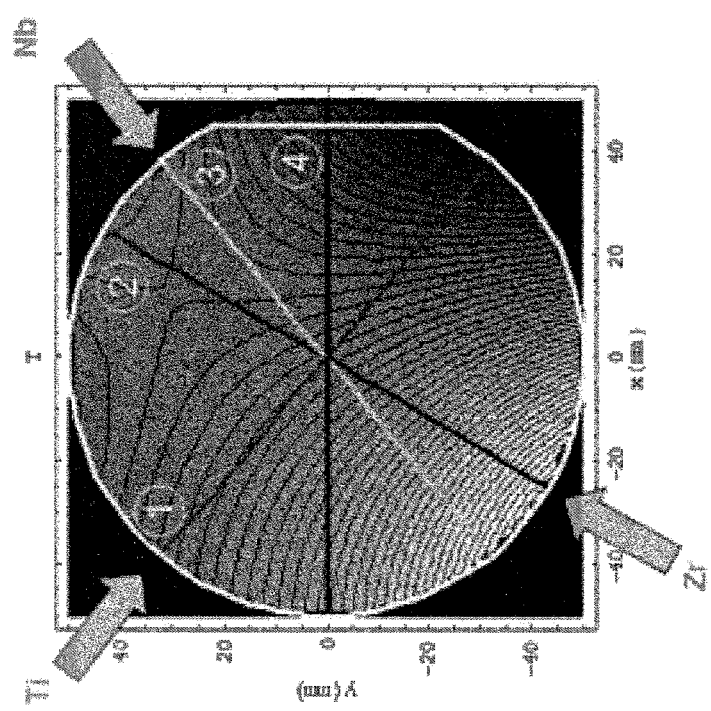
FIG. 5 is an illustration of different chemical precursor molecular species for a ternary oxide thin film (3 elements: Ti, Nb, Zr+ oxygen) with graded flows, resulting in graded chemical composition across the substrate.
Figure 5:
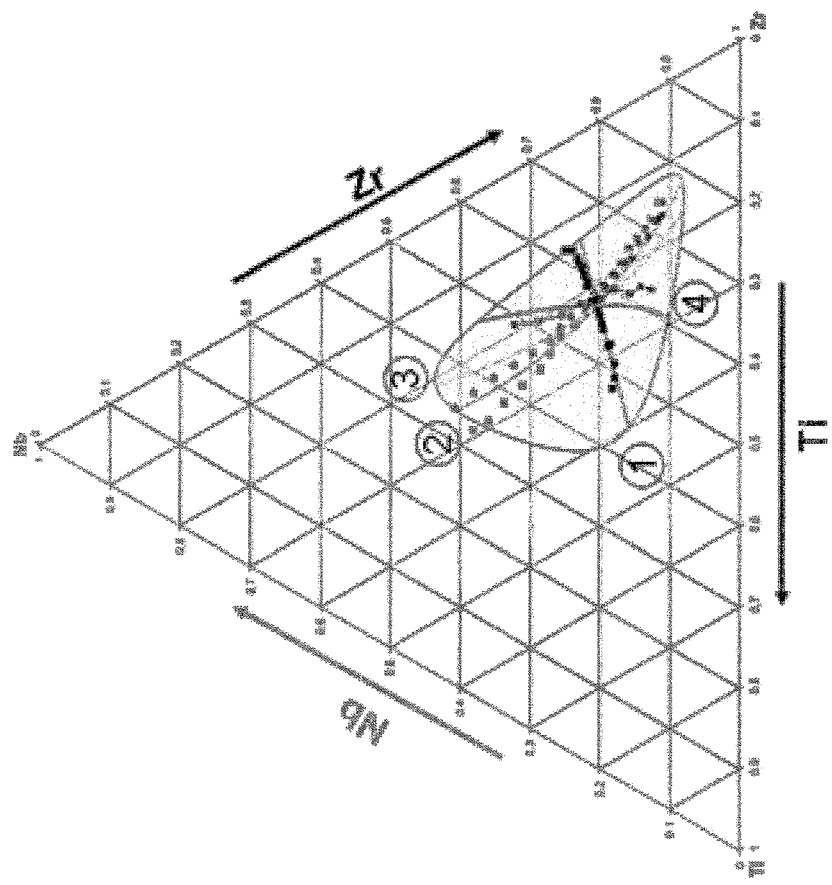

FIG. 5 shows an example of a ternary graded deposit obtained on a wafer, from 3 precursors (titanium tetra-isopropoxide, zirconium tetra-butoxoxide, niobium tetra-ethoxide dimethyl aminoethoxide). The map on the left corresponds to the deposit thickness. On the ternary diagram represented on the right, experimentally measured chemical composition are presented for the 4 different precursor diameters highlighted on the thickness map. The full lines correspond to flow model simulation while dots are experimental points. Such results demonstrate that the presented system is suitable to achieve combinatorial production of coating/devices all with different properties in a single deposition step.

Figure 6:
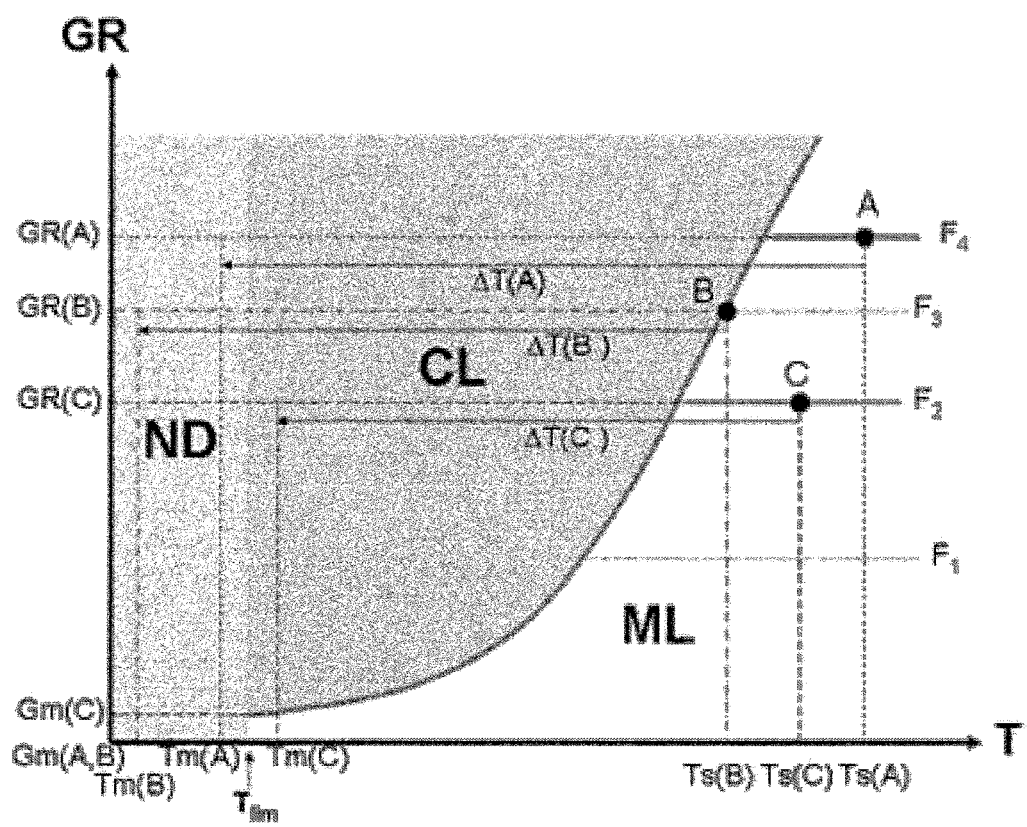
FIG. 6 contains a graph of a typical growth rate GR obtained from a single precursor decomposition as a function of surface temperature T.

FIG. 6 presents a typical growth rate variation (GR) as a function of the surface temperature (T) on which the deposition takes place. Generally, below an offset temperature Tlim, no deposition takes place (regime label: ND). With increasing T, a chemical reaction limited regime (regime label: CL) is achieved, in which the growth rate is independent of impinging precursor flow. With further increasing temperature, a mass limited regime (regime label: ML) is achieved: the transition between the chemical reaction limited and the mass transfer limited regime as well as the growth rate in the mass transfer limited regime depend on the impinging precursor flow. The higher the impinging precursor flow (F1<F2<F3<F4), the higher the transition temperature and the higher the mass limited growth rate.

In the present invention, a difference of temperature $\Delta T$ is observed between substrate and mask. The ideal case is presented as situation A: a mass transport regime is achieved on the substrate surface at surface Ts(A) (all the chemical precursor molecules are decomposed (growth rate GR(A)) and no deposition (growth rate Gm(A)=0) is achieved on the mask surface at temperature Tm(A) (below Tlim). In this optimal case, diffusion (bouncing of molecules) between the substrate surface and the mask is avoided resulting in optimal resolution with limited (or no) halo blurring effects.

In a less favoured situation B, deposition occurs also only on the substrate, but in the chemical reaction limited regime, meaning that some unreacted molecules can bounce between mask and substrate, and contribute to blurring.

In another less favoured situation C, a smaller temperature difference between substrate (temperature Ts(C)) and mask (temperature Tm(C)) is obtained. The deposition occurs both on substrate and mask, but deposition rate on substrate GR(C) is much higher than on mask (Gm(C)).

Figure 7:
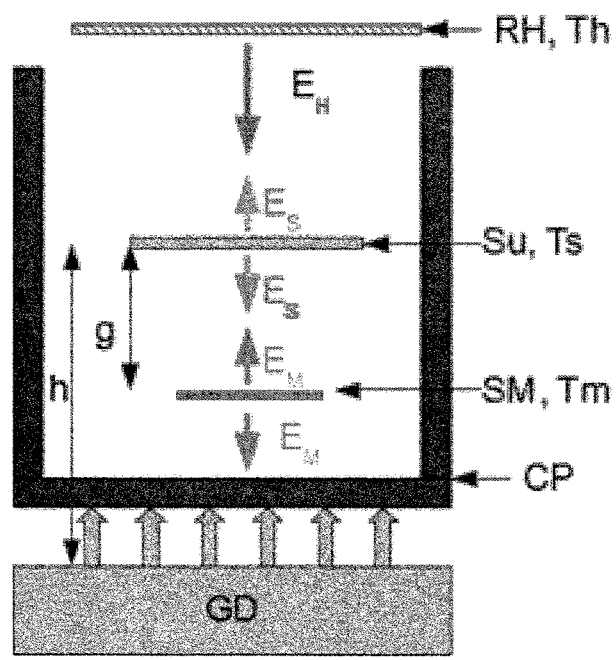
FIG. 7 illustrates main radiative heat flows exchanged in the deposition system.

FIG. 7 describes the preferred method to obtain a temperature difference between mask and substrate. The substrate is heated by a radiative heater RH, that emits towards the substrate a heat flow $E_H$. At equilibrium, the substrate reaches a temperature Ts and emits a radiative heat flow Es towards the mask. The mask receives this heat flow on one side and re-emits a heat flow $E_M$ on both side, so that it reaches at equilibrium a temperature Tm smaller than Ts. Tm (in K) is less than 0.9 Ts (in K). The deposition system makes use of liquid nitrogen cooled cryo-panels (CP).

Same reference numbers will be used throughout the description to designate identical or similar features.

Figure 8:
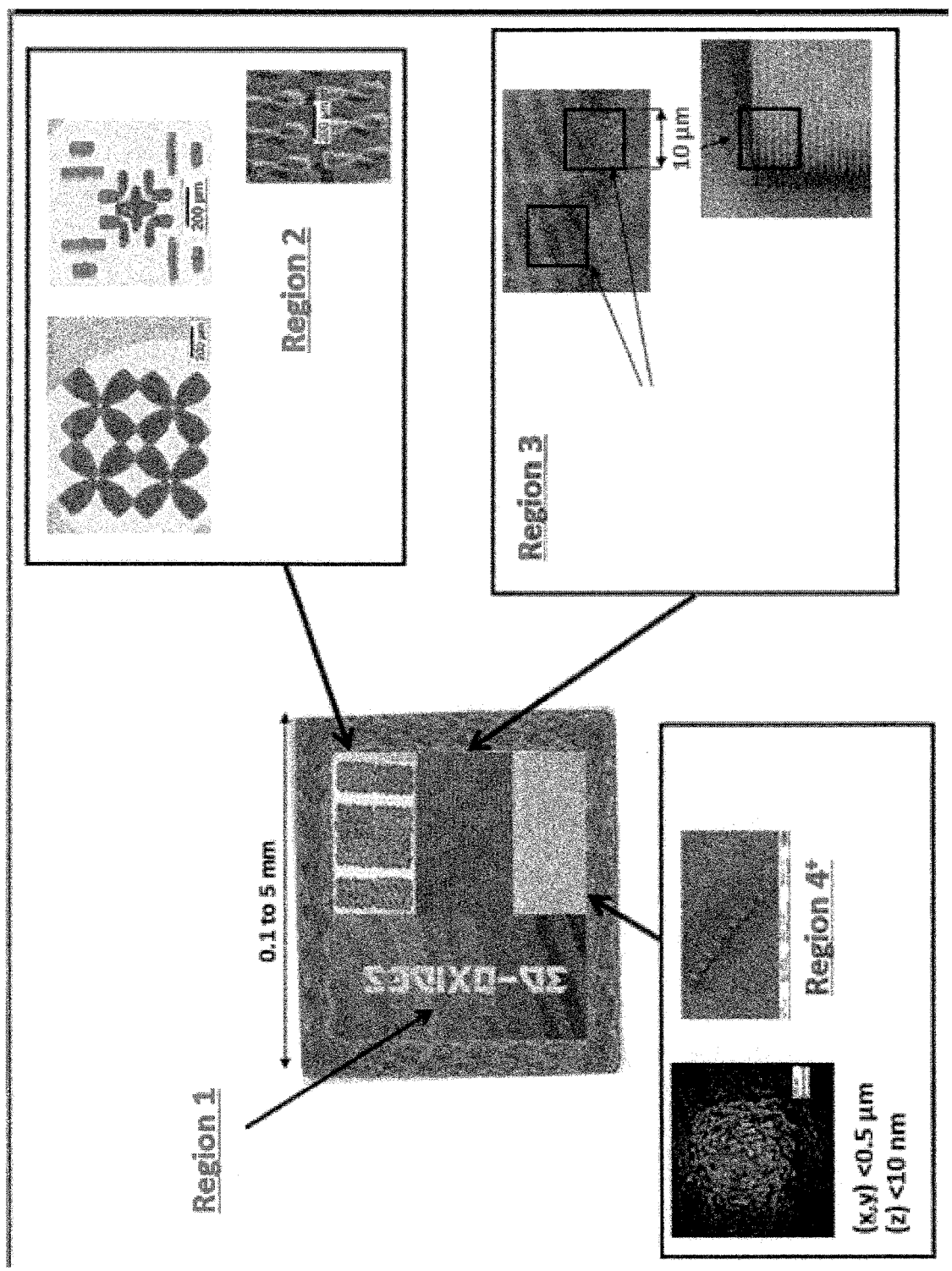
FIG. 8 shows an MF-CODE divided in several regions.
Figure 9:
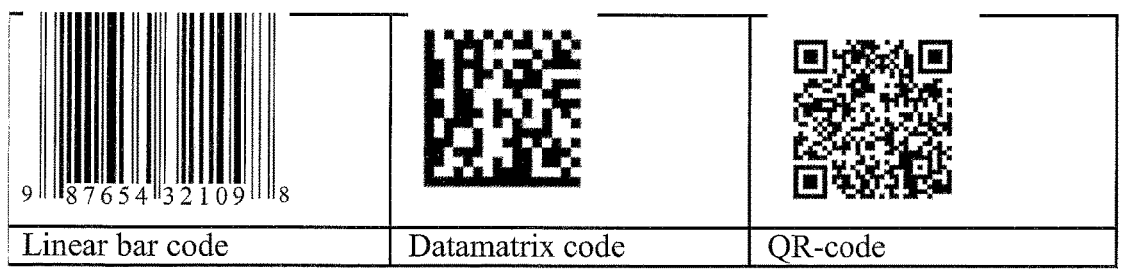
FIG. 9 illustrates several examples of known printed codes.

FIG. 8 shows the MFT-CODE divided in several regions each containing different structures/information at various x-y scales (for example from a few mm to few cm in region 1, from 10 to few hundreds of microns in region 2, from 1 to 10 microns in region 3 and from nano-metric to sub-micrometric scale in region 4), and from nano-metric to several microns in z scales. More regions can be envisaged. Each region could display different functional properties possibly checked by a specific/different measuring/reading device and be attributed to a different specific type of customer. Reading of several multifunctional properties, even within the same region, could be selectively attributed to different customers through different reading techniques.

More than 1 code up to several millions of codes for smallest features can be embedded in a given region. The MFT-Code should contain in preference a macroscopic region that can be identified by naked eye with, one that can be identified by a highly available reader (smart-phone), and one or more further regions with a higher security level and a huger amount of (encrypted) information.

The MFT-Code of FIG. 8 is produced with the preferred technique of CBVD.

In FIG. 8, Region 1 corresponds to structures in x-y from several hundreds of microns to few mm with a z thickness from few nm to several microns. In this region, some structures are visible by naked eyes (ex-letters, numbers, logos, etc. . . ). They are "written" as non deposited region or as thicker or thinner deposit than the background, which consists either on an homogeneous deposit or on a graded composition deposit.

In FIG. 8, Region 2 represents a region where structures with lateral dimensions in the tens of microns scale are produced. These structures can have any shape, different deposits of different shapes can be deposited, fully separated or partially overlapping to generate complex patterns.

In FIG. 8, Region 3 represents a region where deposits with lateral dimensions in the micrometric scale are produced. Deposits can have any shape, different deposits of different shapes can be deposited, fully separated or partially overlapping. Overlapping structures can form a network.

In FIG. 8 Region 4 represents a region where deposits with lateral dimensions in the sub micrometric scale are produced.

Complex colour patterns are achieved and several optical microscope pictures are provided. In Region1 on the left, we have a vertical varying colour (rainbow pattern due to Bragg mirrors) varying from IR (infra-Red) to UV (Ultra-Violet) spectrum.

In Region 1 on the right, we have from top to bottom complex patterns in colours with stereo-effects leading to the impression of 3D topography, a photonic crystal with dots of different colours (thickness) with a few microns resolution, a uniform coating. We also have a complex pattern on the edge with varying colours (between 5 to 10 that can be distinguished by naked eye on the picture) and thin film thickness.

In Region 2 we have different patterns displaying a huge variety of colours and shapes with scales of the order of tens of microns.

In Region 3 we have different patterns displaying a huge variety of colours and shapes with scales of the order of 1 micron.

In Region 3 we have different patterns displaying no colour variation (Scanning Electron Microscopy picture) but different shapes with scales below 1 micron.

The invention provides a process which combines a stencil mask, and more in general a mask, with a chemical precursor in a vacuum deposition process, involving a chemical precursor transported in the molecular flow regime, i.e., with oriented beams, effused by several independent punctual sources that is decomposed on a heated substrate. A temperature dependent chemical reaction leads to precursor decomposition at the substrate surface to form a thin film. The invention has an advantage in that the deposition process is modulated as a function of the precursor flow and the substrate temperature.

If stencil masks have been extensively used to achieve direct patterned thin films in prior art, none of the prior art processes allows to achieve the advantages of the invention as described in sections A to J. The described configurations of the invention allow a very powerful multi-functional thin film material parallel printing with resolution down to the sub micrometre scale and the possibility to achieve such structures in a very cost effective mass production process that can be reconfigured easily to provide a multitude of different structures and properties on a same substrate surface.

The CBVD equipment according to the present invention has the additional favourable characteristic, compared to previous standard CBE deposition reactors, consisting of a precursor delivering unit based on the geometrical distribution of many point sources around the substrate, that enables the generation of independently controlled flow gradients for different precursors across the substrate [62]. This competitive advantage enables the deposition of complex (3-Dimensional, multi-elements, chemical composition gradients) structured oxide films, using a stencil mask, in one step [63,64].

The particularity of the set up described in the invention is that a small band gap g is maintained between the substrate and the mask (see FIG. 2). This gap ensures that there is no direct thermal exchange between substrate and mask, and as the system is maintained under vacuum conditions, thermal exchange by convection is negligible. Consequently, the only thermal exchanges between mask and substrate are radiative. As shown on FIG. 7, the mask receives heat radiative flow from the substrate on one side, and dissipates it on two sides, so at system equilibrium, its temperature Tm is smaller than the substrate temperature Ts. Such a difference in temperature can also be achieved in transient phases (out of thermal equilibrium) such as achieved by pulsed lasers, rapid thermal annealing or as a result of different optical absorption medium of substrate and mask (silicon is transparent to IR, while oxides are not and the reverse is true for visible wavelengths).

Figure 1:
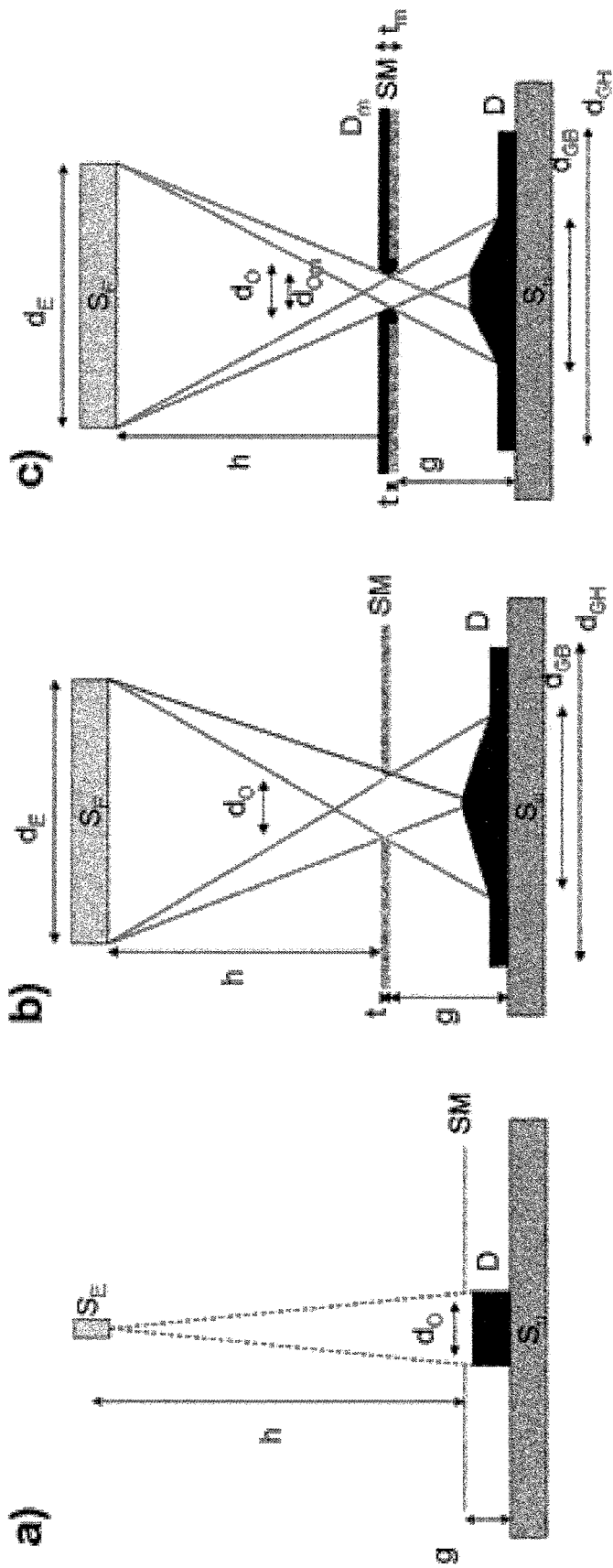

The film deposition on the substrate results from surface decomposition reactions of precursor molecules brought to the substrate as molecular beams. These precursor molecules are typically for oxide deposition metal alkoxides or derivatives (for instance, titanium tetraisopropoxide), β-diketone compounds (for instance, copper bis(2,2,6,6-tetramethyl-3,5-heptanedionato), metal alkyls (for instance, dimethyl zinc), etc. . . . Generally, the deposition growth rate depends on precursor impinging flow and on substrate to be covered temperature as presented in Erreur ! Source du renvoi introuvable. Therefore, due to the substrate difference between substrate and mask, it is possible to obtain a mass transfer limited deposition on the substrate (i.e almost all impinging precursor molecules decompose) without any deposition on the mask or very limited one. In the less favoured case of chemical reaction limited growth on the substrate or on insufficient temperature difference between mask and substrate, the deposition rate on the substrate is still much higher than on the mask. The mass transfer regime on the substrate is to be preferred to optimise deposit structure resolution as it limits the number of un-reacted molecules that may bounce between substrate and mask and contribute to a halo deposit around the structure (see FIG. 1).

The precursor molecules are emitted from small sources that can be considered as punctual from a combinatorial gas delivering system (GD, see FIG. 2). This special design allows the generation of precursor flow gradients on the substrate, which can induce different chemical composition of incident precursor flow at a given substrate point when several precursor compounds are used (see FIG. 5).

The controlled gap g maintained between substrate and mask allows in combination with stencil mask opening design and position of active precursor sources to obtain different thickness deposits through a single mask apertures or different chemical composition deposits (see FIG. 2).

Several advantages are further achieved by the inventive process as described in the following sections A to H.

A.

The introduction of a gap of controlled dimension between the stencil mask and the substrate surface to introduce a temperature difference between the two surfaces, allows obtaining a growth rate difference between the stencil mask and the substrate surface, up to total deposition selectivity on the substrate. Keeping the stencil mask at a lower temperature than at the substrate surface avoids deposition on the stencil mask, thereby extending the lifetime of the mask, promoting reusability of the mask, and brings the possibility to achieve high aspect ratio patterned thin films as mask apertures are not getting clogged as a function of time.

B.

The introduction of the gap of controlled dimension further enables, with a plurality of point-like sources, to obtain different chemical beams emitted in different angular directions from different precursor sources. As a result very complex patterns may be achieved with a single orifice, as all the chemical beam pass through this orifice. Among others, the inventive process allows to respond to a quote of co-deposition of different structures with either different thickness or chemical composition, possibly also achieving controlled chemical composition gradients at different scales down to sub-micrometre scale.

C.

Several layers of thermal shielding can be used, by interposing several surfaces between the substrate surface and the stencil mask, to increase temperature gradient and improve selectivity. This improved selectivity can also be achieved by adding "blocking" precursors blown tangentially to the stencil mask such that they impinge exclusively on the mask surface and not on the substrate.

D.

The inventive process achieves a mass transport limited regime on the substrate surface and no deposition on the stencil mask surface is one of the key factors to achieve neat border avoiding diffusion/bouncing of unreacted molecules between the substrate and the stencil mask back surface that can lead to blurring and low resolutions structures. The second key factor is to have point-like sources, whereby source diameter is small in comparison to the distance of the source to the substrate to improve resolution and/or shape of the structures achieved through the stencil mask opening/apertures.

E.

Thin films structures achieved through the stencil mask can be varied in size by simple variation of the ratio between g and h, where g is the stencil mask to substrate surface distance and h is the stencil mask to source distance. Modulation during the growth of this distance allows high flexibility in shapes and sizes of the thin film patterns.

F.

In a particularly advantageous example embodiment, combinatorial at macro, i.e, full wafer, or sub-micro-level is coupled to the shadow mask deposition process by controlling either chemical flows species impinging rate and/or temperature on the substrate with previously described arrangements to achieve in a controlled way a plurality of very different materials (chemical composition, structures shapes and sizes and interfaces) on the substrate surface. This allows a huge variability of structures depending on the substrate position and flow conditions even with the same mask and improved combinatorial methodology for material properties investigation allowing variation not only at the chemical composition level, but also at the (nano)-size, shape or interfaces interactions level.

G.

In a further particularly advantageous example embodiment, a part of the produced thin film is modified by laser irradiation either during deposition or in a post deposition process. In opposition to standard laser marking resulting in a visible or invisible mark, the present irradiation process provides a densification or phase transition resulting in a wider range of functionalities variation, including, but not limited to, optical properties such as optical thickness and/or refractive index, electrical conductivity, wettability, 3D-topography, etc.

H.

Different packaging is available. In particular, the tag can be achieved on very thin metallic foils to provide a sealing solution that will be torn apart when a container is open (tamper-evidence solution). In alternative, the tag can be embedded in polymer foils if a more robust solution is required or directly melted into a material such a glass bottle or different other transparent media as the tag can withstand high temperatures and the thin film material has a higher refractive index (n=2.4 for TiO2 for example in comparison to n=1.5 for polymers or glass). Finally, the tag deposition process is CMOS compatible and/or standard microelectronics processes compatible. Hence the process can be achieved directly onto a device such as a CMOS camera, a sensor or any other integrated electronic/photonic/etc circuit with direct vertical/monolithic integration. This process is highly desirable to achieve embedded cyber-security functionality and connection to the internet with cryptography protocols. This description is added as an additional advantage, but should have been trivial from an expert in the field from following description.

I.

The multifunctional material constituting the tag can provide further functionalities such as sensing, energy harvesting or more complex functionalities. Among others, we disclose the possibility to use the tag to do chemical composition analysis of samples such as liquids looking at the pattern/properties variation of the tag in contact with such a sample. Hence the features of the tag can be directly integrated within more complex devices in a single step further reducing production costs shared between several functionalities. This description is added as an additional advantage, but should have been trivial from an expert in the field from following description.

J.

The multifunctional material properties can be read by a plurality of different readers/analysis methods. The exact reading technique can be made private and could evolve with time or as a function of different customers/users. Because of this evolving reading technique, we coined a new technical term, namely an ultra-covert solution that will make more difficult forgery. This description is added as an additional advantage, but should have been trivial from an expert in the field from following description.

The invention generally provides a tag device, which equivalently designates a code, a tag, an etiquette, a mark, or a dedicated device that will be called MFT-CODE (Multi-Functional Traceable Code) in the following, merging the concept of the different tracking codes (QR, Datamatrix, flash-code among others) with authentication and the security concept of anti-counterfeiting features. Unlike previously discussed state of the art for traceability, i.e., tracking codes that have only a 2 dimensional pattern and display a limited colour variation, mainly black and white, we provide a solution with increased dimensionality such as a 3D topography, with z variation, and a plurality of different functionalities/properties mapping based on various physical and chemical measurable properties (iridescent colours, reflectivity variation, light scattering, wettability variation, electrical conductivity variation, piezoelectricity, ferro-electricity, magnetism, and most of the physical/chemical properties displayed by multi-functional materials). Our advantage is that a single layer is required and that the various effects cannot be separated in various independent solutions, thus providing a higher degree of security.

The proposed approach to achieve the described MFT-CODE is through the use of a high-resolution patterned thin film, layer, or coating of a multi-functional material such as a semiconductor, ceramic or other material on a substrate. A preferred disclosed solution is with a multi-functional oxide thin film.

Such properties mapping will provide a highly secure solution that displays most of the anti-counterfeiting features today available on the market, but simultaneously, to avoid duplications of the MFT-CODE or counterfeited lecture of the same and furthermore contains a huge quantity of organized information in its high-resolution pattern.

The proposed MFT-CODE is thus able to address all the challenges reported for traceability, security and cyber-security in a single object: it contains a huge quantity of information, obtained by miniaturization of organized patterns and/or structures with lateral dimensions from cm size down to the sub-micrometre or even down to nano level, provides a high level of security, most of the available existing solutions for anti-counterfeiting tags, and provides a hardware cryptographic key solution able to provide in a fraction of second several thousands/millions of different codes in a highly secured way. A possible encrypting method is related to book cipher where two identical tags are used as code-keys, but other methods are also available.

An important feature of the MFT-CODE according to the invention is the possibility to achieve different size and/or functions of the features distributed on a partition of the MFT-CODE allowing different reading techniques, privileging either availability, cost, and/or transportability of the reader, or increased security depending on the investigated region of the MFT-CODE.

Further from all these security solutions, we may also propose an investigation related to the size of the proposed mark and/or patterns, namely a multi-reader solution. Actually, there are all the possible sizes available: larger ones are of interest for naked eye identification, but nearly no information is contained at this scale. On the opposite approach, nano solutions are used to achieve invisible codes that can be identified only with special equipment, in order to increase security. However, such small marks/tags can be very complicated to find if no reference is provided. The idea to provide in a single solution different scales may help in reinforcing the security and in finding rapidly where the information/security tag is with simple visual references embedded in the MFT-CODE.

In particular, referring to FIG. 8 which represents an MFT-Code, the MFT-Code comprises a Region 1 where a uniform deposit or a deposit with macro-graded properties is achieved—with regards to one up to all the displayed functional properties —that can be modified in a second processing step. Said modifications in a second step could be achieved by beam irradiation (laser, electron, ions, etc. . . ) or by any other method (mechanical machining, chemical etching or functionalisation, or any other method) to modify selectively one or more of the functional properties of the MFT-CODE. The preferred disclosed modification technique is through induced crystalline phase transition or by chemical composition changing of the MFT-CODE material. Said region would be principally used for further customisation of the MFT-CODE in a second step by a different actor not involved in the main tag manufacturing. Laser-induced phase transition is the preferred method. In particular, this region is highly suitable to embed a coloured aesthetic logo or a tracking number/code. Naked eye patterns such as holographic or other diffractive features may also be embedded using optical properties variation related to crystalline phase variation and/or material densification or chemical composition shifts. In particular, varying selectively the multi-functional film optical thickness (densification through crystalline phase shift) could allow achieving a wavelength reflected light intensity selectivity/modulation with increased sensitivity to a wide number of different selected wavelengths. In other words, modulation of the irradiation (or other additional process) conditions to modify the thin film leads to different patterns with different wavelength sensitivity. Electrical conductivity modulation may also be achieved for example with TCO that display a different conductivity as a function of the crystalline phase (like $TiO_2$ doped with Nb where anatase displays a different electrical conductivity in comparison to rutile or with other materials like ZnO:Al or vanadium oxide phase transition). Several other functionalities like catalysis or bio-compatibility also strongly depend on the phase for a given material.

$LiNbO_3$ is also a interesting material due to its ability to be used as holography data storage medium.

The preferred reader for this Region 1 is a Smartphone, but naked eye is also suitable to identify features such as colour patterns. Also a multi-meter, e.g., ohm-meter, or any other low cost reader, such as CD or DVD readers, is suitable to identify other pattern properties. Droplets of various liquids may also be used to test the surface wettability or the catalytic properties such that the result is made apparent to the naked eye or to a Smartphone or other low cost readers or measuring devices.

A further reader could be provided by any microelectronic device in which the tag could be integrated (vertical integration or by different packaging solution).

Referring again to FIG. 8, in the second, third and fourth (and any further number) regions, i.e., Region 2, Region 3 and Region 4, a higher resolution of the pattern is achieved with progressive resolution improvement. A parallel printing method is proposed to avoid limited serial printing/marking techniques throughput that are getting time consuming and less precise and cost efficient as the features scale decreases. In this region, the pattern is preferably achieved by direct growth of a multi-functionally patterned thin film with an additive printing method and/or technology. In particular, we propose to use shadow masks in combination with a vacuum deposition technique involving chemical precursor decomposition to achieve selective deposition through the control of either energy or impinging species flows on the substrate. In comparison to the state of the art, we propose to achieve a cost effective mass production of all-different MFT-CODES with a bijective relation between a code and an object/concept/person/information (one code that is unique to each single object). This feature cannot be achieved in prior art with parallel printing as a different mask should be manufactured for each MFT-CODE resulting in an extremely expensive manufacturing process. Instead of varying the mask feature, the invention proposes to vary either the provided energy to induce precursor deposition or the impinging species (precursor, co-reactive species) flows on the substrate that can be easily modulated in the disclosed configuration, achieving a combinatorial generation of the MFT-CODES and of their properties.

At high resolution (sub-micron), the MFT-CODE displays similar features as CD or DVD, but instead of having a binary code, the multi-functionality allows to achieve hundreds of different values for each dot leading to improved security and number of arrangements.

At nanometre level, self assembly (auto-organized) features could also be introduced exploiting precursor diffusivity variation as a function of the deposition conditions (energy and chemical precursor flows, temperature, etc. . .) to embed further security into the patterns. In opposition to the nano-inks achieved patterns, regular patterns could be obtained. This is considered as an advantage as nano-inks only provide random nano-patterns containing no information or security in comparison to ordered patterns. Such self-assembly effects have a huge impact on functional properties such as light diffusion, catalytic activity, etc. Furthermore, they cannot be easily identified by reverse-engineering and improve the number of the parameters/combinations to something beyond analysis investigation.

REFERENCES

[1] Biswas, A.; Bayer, I. S.; Biris, A. S.; Wang, T.; Dervishi, E. & Faupel, F. (2012). *Advances in top-down and bottom-up surface nanofabrication: Techniques, applications\& future prospects,* Advances In Colloid and Interface Science 170 : 2-27.

[2] Waller, G. H.; Stein, A. & Abiade, J. T. (2012). *Nanofabrication of doped, complex oxides,* Journal of Vacuum Science \& Technology B 30 : 011804.

[3] Schlom, D. G.; Chen, L. Q.; Pan, X. Q.; Schmehl, A. & Zurbuchen, M. A. (2008). *A thin film approach to engineering functionality into oxides,* Journal Of The American Ceramic Society 91 : 2429-2454.

[4] Blamire, M. G.; MacManus-Driscoll, J. L.; Mathur, N. D. & Barber, Z. H. (2009). *The Materials Science of Functional Oxide Thin Films*, Advanced Materials 21 : 3827-3839.

[5] Heber, J. (2009). *Materials science: Enter the oxides*, Nature 459 : 28-30.

[6] Kim, G. M.; van den Boogaart, M. A. F. & Brugger, J. (2003). *Fabrication and application of a full wafer size micro/nanostencil for multiple length-scale surface patterning*, Microelectronic Engineering 67-68: 609-614.

[7] Arcamone, J.; van den Boogaart, M. A. F.; Serra-Graells, F.; Fraxedas, J.; Brugger, J. & Perez-Murano, F. (2008). *Full-wafer fabrication by nanostencil lithography of micro/nanomechanical mass sensors monolithically integrated with CMOS*, Nanotechnology 19 : 305302.

[8] Lindquist, N. C.; Nagpal, P.; McPeak, K. M.; Norris, D. J. & O h, S.-H. (2012). *Engineering metallic nanostructures for plasmonics and nanophotonics*, Reports On Progress In Physics 75 : 036501.

[9] Villanueva, L. G.; Martin-Olmos, C.; Vazquez-Mena, O.; Montserrat, J.; Langlet, P.; Bausells, J. & Brugger, J. (2011). *Localized Ion Implantation Through Micro/Nanostencil Masks*, Ieee Transactions On Nanotechnology 10 : 940-946.

[10] Lishchynska, M.; Bourenkov, V.; van den Boogaart, M. A. F.; Doeswijk, L.; Brugger, J. & Greer, J. C. (2007). *Predicting mask distortion, clogging and pattern transfer for stencil lithography*, Microelectronic Engineering 84 : 42-53.

[11] Sidler, K.; Villanueva, L. G.; Vazquez-Mena, O.; Savu, V. & Brugger, J. (2012). *Compliant membranes improve resolution in full-wafer micro/nanostencil lithography*, Nanoscale 4 : 773-778.

[12] Savu, V.; Xie, S. & Brugger, J. (2011). *100 mm dynamic stencils pattern sub-micrometre structures*, Nanoscale 3 : 2739-2742.

[13] Yan, X. M.; Contreras, A. M.; Koebel, M. M.; Liddle, J. A. & Somorjai, G. A. (2005). *Parallel fabrication of sub-50-nm uniformly sized nanoparticles by deposition through a patterned silicon nitride nanostencil*, Nano Letters 5 : 1129-1134.

[14] van den Boogaart, M. A. F.; Doeswijk, L. M. & Brugger, J. (2006). *Silicon-supported membranes for improved large-area and high-density micro/nanostencil lithography*, Journal of Microelectromechanical Systems 15 : 1663-1670.

[15] van den Boogaart, M. A. F.; Lishchynska, M.; Doeswijk, L. M.; Greer, J. C. & Brugger, J. (2006). *Corrugated membranes for improved pattern definition with micro/nanostencil lithography*, Sensors and Actuators A-physical 130-131: 568-574.

[16] Villanueva, G.; Vazquez-Mena, 0.; van den Boogaart, M. A. F.; Sidler, K.; Pataky, K.; Savu, V. & Brugger, J. (2008). *Etching of sub-micrometer structures through Stencil*, Microelectronic Engineering 85 : 1010-1014.

[17] Viallet, B.; Grisolia, J.; Ressier, L.; Van den Boogaart, M. A. F.; Brugger, J. & Lebraud, T. (2008). *Stencil-assisted reactive ion etching for micro and nano patterning*, Microelectronic Engineering 85 : 1705-1708.

[18] Cojocaru, C. V.; Harnagea, C.; Rosei, F.; Pignolet, A.; van den Boogaart, M. A. F. & Brugger, J. (2005). *Complex oxide nanostructures by pulsed laser deposition through nanostencils*, Applied Physics Letters 86 : 183107.

[19] to Riele, P. t.; Janssens, A.; Rijnders, G. & Blank, D. H. A. (2007). *Direct patterning of complex oxides by pulsed laser deposition through stencils*, Journal of Physics: Conference Series 59 : 404-407.

[20] Nechache, R.; Cojocaru, C. V.; Harnagea, C.; Nauenheim, C.; Nicklaus, M.; Ruediger, A.; Rosei, F. & Pignolet, A. (2011). *Epitaxial Patterning of $Bi_2FeCrO_6$ Double Perovskite Nanostructures: Multiferroic at Room Temperature*, Advanced Materials 23 : 1724-1729.

[21] Barnabe, A.; Lalanne, M.; Presmanes, L.; Soon, J. M.; Tailhades, P.; Dumas, C.; Grisolia, J.; Arbouet, A.; Paillard, V.; BenAssayag, G.; van den Boogaart, M. A. F.; Savu, V.; Brugger, J. & Normand, P. (2009). *Structured ZnO-based contacts deposited by non-reactive rf magnetron sputtering on ultra-thin $SiO_2$/Si through a stencil mask*, Thin Solid Films 518: 1044-1047.

[22] Kohler, J.; Albrecht, M.; Musil, C. R. & Bucher, E. (1999). *Direct growth of nanostructures by deposition through an $Si_3N_4$ shadow mask*, Physica E 4 : 196-200.

[23] Gross, L.; Schlittler, R. R.; Meyer, G. & Allenspach, R. (2010). *Magnetologic devices fabricated by nanostencil lithography*, Nanotechnology 21 : 325301.

[24] Cvetkovic, N. V.; Sidler, K.; Savu, V.; Brugger, J.; Tsamados, D. & Ionescu, A. M. (2011). *Three-level stencil alignment fabrication of a high-k gate stack organic thin film transistor*, Microelectronic Engineering 88 : 2496-2499.

[25] Tsang, W. T. (1985). *Selective Area Growth of GaAs and $In_{0.53}Ga_{0.47}$ as Epilayer Structures By Chemical Beam Epitaxy Using Silicon Shadow Masks—A Demonstration of the Beam Nature*, Applied Physics Letters 46 : 742-744.

[26] Tsang, W. T. (1993). *Selective-area Epitaxy and Etching By Chemical Beam Epitaxy*, Semiconductor Science and Technology 8 : 1016-1022.

[27] Balmer, R. S.; Martin, T.; Kane, M. J.; Maclean, J. O.; Whitaker, T. J.; Ayling, S. G.; Calcott, P. D. J.; Houlton, M.; Newey, J. P. & O'Mahony, S. J. (2000). *Integrated laser/waveguide by shadow-masked selective area epitaxy using chemical beam epitaxy (CBE)*, Journal of Crystal Growth 209 : 486:491.

[28] Heinecke, H.; Brauers, A.; Grafahrend, F.; Plass, C.; Putz, N.; Werner, K.; weyers, M.; Luth, H. & Balk, P. (1986). *Selective Growth of Gaas In the MOMBE and MOCVD Systems*, Journal of Crystal Growth 77 : 303-309.

[29] Dipika Bansal, Swathi Malla, Kapil Gudala, and Pramil Tiwari. (2013) *Anti-counterfeit technologies: a pharmaceutical industry perspective*. Scientia pharmaceutica, 81(1):1-13.

[30] Ling Li. (2013) *Technology designed to combat fakes in the global supply chain*. Business Horizons, 56(2):167-177.

[31] Mindaugas Andrulevicius. (2011) *Methods and applications of optical holography*. Materials Science-medziagotyra, 17(4):371-377.

[32] C. Bright. (1998) *Vacuum web coating of optically variable thin films for security applications*, Proceedings Of Twelfth International Conference On Vacuum Web Coating, 112-118.

[33] E. D. Tsougenis, G. A. Papakostas, D. E. Koulouriotis, and V. D. Tourassis. (2012) *Performance evaluation of moment-based watermarking methods: A review*. Journal of Systems and Software, 85(8):1864-1884.

[34] Tae-Yi Kang Byounghyun Kim Oc-Yeub Jeon Joong Lee, Seong G. Kong. (2014) *Invisible ink mark detection in the visible spectrum using absorption difference*. Forensic Science International, 236:77-83.

[35] Mojca Friskovec, Rahela Kulcar, and Marta Klanjsek Gunde. (2013) *Light fastness and high-temperature stability of thermochromic printing inks*. Coloration Technology, 129(3):214-222.

[36] Daniela Paunescu, Michela Puddu, Justus O. B. Soellner, Philipp R. Stoessel, and Robert N. Grass. (2013)

*Reversible DNA encapsulation in silica to produce ROS-9resistant and heat-resistant synthetic DNA 'fossils'*. Nature Protocols, 8(12):2440-2448.

[37] Pim Tuylsl and Lejla Batina. RFID-tags for anti-counterfeiting. http://www.cosic.esat.kuleuven.be/publications/article-621.pdf

[38] Will. Soutter. Anti-counterfeiting applications for nanotechnology. http://www.azonano.com/article.aspx?ArticleID=3084.

[39] C.A. Bishop. (2000) *The use of vacuum deposited coatings for security applications.* $43^{rd}$ Annual Technical Conference Proceedings (2000) ISSN 0737-5921,1-6.

[40] Han-Qiao Shi, Wan-Nan Li, Li-Wei Sun, Yu Liu, Hong-Mei Xiao, and Shao-Yun Fu. (2011) *Synthesis of silane surface modified ZnO quantum dots with ultrastable, strong and tunable luminescence.* Chemical Communications, 47(43): 11921-11923.

[41] P. G. Coombs, V. P. Raksha, and T. Markantes. (2002) *Overt and covert verification via magnetic optical security devices,* Proc. SPIE 4677, Optical Security and Counterfeit Deterrence Techniques IV, 182.

[42] Yan Cui, Ravi S. Hegde, In Yee Phang, Hiang Kwee Lee, and Xing Yi Ling. (2014) *Encoding molecular information in plasmonic nanostructures for anti-counterfeiting applications.* Nanoscale, 6(1):282-288.

[43] K. D. Osberg, M. Rycenga, G. R. Bourret, K. A. Brown, and C. A. Mirkin. (2012) *Dispersible surface-enhanced raman scattering nanosheets.* Advanced Materials, 24(45):6065-6070.

[44] Makoto Naruse, Naoya Tate, and Motoichi Ohtsu. (2012) *Optical security based on near-field processes at the nanoscale.* Journal of Optics, 14(9):094002.

[45] Francesco Flora Luca Mezi Daniele Murra-Amalia Torre Francesca Bonfigli Rosa Maria Montereali Maria Aurora Vincenti Sarah Bollanti, Paolo Di Lazzaro. (2012) *Is this artwork original or is it a copy? the answer by a new anti-counterfeiting tag.* EAI Speciale, 162-168.

[46] P. Di Lazzaro, S. Bollanti, F. Flora, L. Mezi, D. Murra, A. Torre, F. Bonfigli, R. M. Montereali, and M. A. Vincenti. (2013) *Extreme ultraviolet marking system for anti-counterfeiting tags with adjustable security level.* Proc. SPIE vol. 8677, 86770T.

[47] Jun Xu and Zhiguang Guo (2013). Biomimetic photonic materials with tunable structural colors. *Journal of Colloid and Interface Science,* 406:1-17.

[48] Bora Yoon, Jung Lee, In Sung Park, Seongho Jeon, Joosub Lee, and Jong-Man Kim. (2013) *Recent functional material based approaches to prevent and detect counterfeiting.* Journal of Materials Chemistry C, 1(13):2388-2403.

[49] Cheng-fu Zheng, Nian-wu Li, Shi-hui Zhu, Xing-jun Lv, and Fan-di Zeng. (2010) *Situation and development of the material used for anti-counterfeiting.* Proceedings of the $7^{th}$ National Conference On Chinese Functional Materials and Applications , 1-3,2148-2152.

[50] Takashi Matsumura, Fumio Iida, Takuya Hirose, and Masahiko Yoshino. *Micro machining for control of wettability with surface topography* (2012) Journal of Materials Processing Technology, 212(12):2669-2677.

[51] E. W. T. Ngai, Karen K. L. Moon, Frederick J. Riggins, and Candace Y. Yi. (2008) *RFID research: An academic literature review* (1995-2005) *and future research directions.* International Journal of Production Economics, 112(2):510-520.

[52] RFID Journal, Frequently asked question, http ://www.rfidjournal.com/faq/show? 85

[53] Alvaro A. Cardenas, Pratyusa K. Manadhata, and Sreeranga P. Rajan. (2013) *Big data analytics for security.* IEEE Security & Privacy, 11(6):74-76.

[54] Carlo Maria Medaglia and Alexandru Serbanati. (2010) *An overview of privacy and security issues in the Internet of things.* Internet of Things, p.389-395.

[55] Rodrigo Roman, Jianying Zhou, and Javier Lopez. (2013) *On the features and challenges of security and privacy in distributed internet of things.* Computer Networks, 57(10):2266-2279.

[56] Bin-xing Yang, Jin-cui; Fang. (2011) *Security model and key technologies for the internet of things.* The Journal of China Universities of Posts and Telecommunications, 18 (sup 2):109-112.

[57] R. H. Weber. (2010) *Internet of things—new security and privacy challenges.* Computer Law & Security Review, 26:23-30.

[58] Rajkumar; Marusic Slaven; Palaniswami Marimuthu Gubbi, Jayavardhana; Buyyab. (2013) *Internet of things* (IoT): *A vision, architectural elements, and future directions.* Future Generation Computer Systems, 26:1645-1660.

[59] Zhi-Gang; Chen, Xian-Yi ; Jin. (2013) *Research on key technology and applications for internet of things.* Physics Procedia, 33:561-566.

[60] Nathalie Mitton and David Simplot-Ryl. (2011) *From the internet of things to the internet of the physical world.* Comptes Rendus Physique, 12(7): 669-674.

[61] Almudena Alcaide, Esther Palomar, Jose Montero-Castillo, and Arturo Ribagorda. (2013) *Anonymous authentication for privacy-preserving IoT target-driven applications.* Computers & Security, 37:111-123.

[62] Wagner, E. , Sandu, C., Harada, S. , Benvenuti, G. (2014) *Efficient Chemical Beam Vapour Deposition system for combinatorial thin oxide film deposition: simulations and experiments,* submitted to ACS Combinatorial.

[63] Wagner, E. , Sandu, C.S., Harada, S. , Benvenuti, G. , Savu V, Muralt P. (2014) *Fabrication of complex oxide microstructures by combinatorial chemical beam vapour deposition through stencil masks,* accepted for publication in Thin Solid Films.

[64] Sandu, C., Wagner, E. , Harada, S. , Savu V., Muralt P., Benvenuti, G. et al. (2014) *Complex 3D multi element structured oxide films obtained by Combinatorial Chemical Beam Vapour Deposition through stencil masks.* To be published.

PATENT REFERENCES

U.S. Pat. No. 4,013,502 (A)—Mar. 22, 1977: Stencil process for high resolution pattern replication US2013092081 (A1)—Apr. 18, 2013: Shadow Mask for Patterned Deposition on Substrates WO2006022651 (A1)—Mar. 2, 2006: system for and method of ensuring accurate shadow mask to substrate registration in a deposition process US 2013/0122197 A1—May 16, 2013: Securing Of Shadow Mask And Substrate On Susceptor Of Deposition Apparatus.

The invention claimed is:

1. A chemical gas phase deposition process comprising steps of:
providing a high vacuum chamber;
positioning a substrate surface inside the high vacuum chamber;
positioning a mask parallel to the substrate surface, the mask including one or more openings;

providing a gap of determined dimension between the substrate surface and the mask to introduce a temperature difference between the substrate surface and the mask, wherein said gap is adjustable; and orienting a plurality of chemical precursor beams of at least one precursor species towards the mask with line of sight propagation, each of the plurality of chemical precursor beams being emitted from an independent punctual source, and molecules of the chemical precursor pass through the one or more mask openings to impinge onto the substrate surface for deposition thereon, at least a part of the chemical precursor molecules decompose on the substrate surface at a decomposition temperature; and adjusting a temperature of the substrate surface greater or equal to the chemical precursor molecule decomposition temperature to remain greater than a mask temperature, and maintaining the mask temperature below the decomposition temperature, thereby causing a decomposition of the chemical precursor and a growth of a film on the substrate surface, but not on the mask, heating the substrate surface using a heating device; wherein the chemical gas phase deposition process is operated under vacuum conditions below $10^{-5}$ mbar; wherein the substrate surface is positioned between the heating device and the mask and the distance of the mask to the substrate is smaller than the distance of the mask to the precursor sources.

2. The chemical gas phase deposition process of claim 1, wherein the substrate temperature is achieved at least by rapid thermal annealing.

3. The chemical gas phase deposition process of claim 1, wherein the substrate temperature is achieved by short laser pulses irradiation and/or exploiting different wavelength absorption of substrate and mask material.

4. The chemical gas phase deposition process of claim 1, wherein the step of orienting the plurality of chemical precursor beams comprises adjusting for at least two of the plurality of chemical precursor beams respective angular directions that differ amongst each other, thereby creating at least two different chemical beams that pass simultaneously through the one or more openings, and causing a co-deposition of different either separated or superimposed structures on the substrate surface.

5. The chemical gas phase deposition process of claim 4, further comprising:

modulating a first of the two of the plurality of chemical precursor beams and modulating a second of the two of the plurality of chemical precursor beams to control for the co-deposition of different structures either one or several of the following: a thickness of the different structures, a chemical composition of the different structures, a chemical composition gradient of the different structures.

6. The chemical gas phase deposition process of claim 1, further comprising:

adding at least a first surface between the substrate surface and the mask or between the mask and the chemical precursor sources, consisting in a thin foil with openings corresponding to mask openings.

7. The chemical gas phase deposition process of claim 1, further comprising:

providing a flow of a different chemical precursor, wherein the different chemical precursor differs from any chemical precursor of the plurality of chemical precursor beams, wherein the different chemical precursor has a higher decomposition temperature in comparison to a main precursor of the plurality of chemical precursors used to achieve a thin film, by blowing the further flow in a direction substantially tangential to the mask, thereby minimizing the impinging rate of the further flow on the substrate, but optimizing the impinging rate of the further flow on the mask surface, the different chemical precursor being used to inhibit decomposition of the main precursor on the mask, but not on the substrate.

8. The chemical gas phase deposition process of claim 1, comprising setting a determined ratio between a distance separating the mask and the substrate surface, and a distance separating at least one of the punctual sources from the mask.

9. The chemical gas phase deposition process of claim 8, comprising modulating the ratio between substrate to mask and mask to source distances during the deposition.

10. The chemical gas phase deposition process of claim 1, wherein the distance of the mask to the substrate is smaller or of the same order of magnitude than the distance between the holes in the mask.

11. The chemical gas phase deposition process of claim 1, wherein the step of orienting the plurality of chemical precursor beams further includes:

producing non uniform flows over the substrate surface; wherein chemical precursor molecule impinging rates are graded.

12. The chemical gas phase deposition process of claim 1, further comprising varying chemical precursor molecules impinging angles as a function of the position on the substrate and gap.

13. The chemical gas phase deposition process of claim 1, further comprising:

varying the deposited material, its properties and patterns without changing the mask, but one or more of the following parameters: flow intensities of the chemical precursor(s), number and position of the sources used by turning any one of the sources on or off, and the substrate-mask gap distance.

14. The chemical gas phase deposition process of claim 1, wherein the independent punctual sources are capable of being moved at respective angular directions that different from each other.

15. The chemical gas phase deposition process of claim 1, wherein the independent punctual sources are capable of being independently switched at will on and off.

16. A chemical gas phase deposition process comprising the steps of:

providing a high vacuum chamber;

positioning a substrate surface inside the high vacuum chamber;

positioning a mask parallel to the substrate surface, the mask including one or more openings;

providing a gap of determined dimension between the substrate surface and the mask to introduce a temperature difference between the mask and the substrate, wherein said gap is adjustable;

orienting a plurality of chemical precursor beams of at least one precursor species towards the mask with line of sight propagation, each of the plurality of chemical precursor beams being emitted from an independent punctual source, and molecules of the chemical precursor pass through the one or more mask openings to impinge onto the substrate surface for deposition thereon, at least a part of the chemical precursor molecules decomposing on the substrate surface at a decomposition temperature; and adjusting a temperature of the substrate surface greater or equal to the chemical precursor molecule decomposition temperature to remain greater than a mask temperature, and maintaining the mask temperature below the decomposition temperature, thereby causing a decomposition of the chemical precursor and a growth of a film on the substrate surface, but not on the mask, heating the substrate surface using a heating device, the mask temperature being a function of the temperature of the substrate surface, the gap inhibiting heat transfer by conduction, the substrate emitting a radiative heat flow towards the mask and the mask receiving said heat flow on one side and re-emitting a heat flow on both sides;

wherein the chemical gas phase deposition process is operated under vacuum conditions below $10^{-5}$ mbar; wherein the substrate surface is positioned between the heating device and the mask and the distance of the mask to the substrate surface is smaller than the distance of the mask to the precursor sources.

17. A chemical gas phase deposition process comprising the steps of:

providing a high vacuum chamber;

positioning a substrate surface inside the high vacuum chamber;

positioning a mask parallel to the substrate surface, the mask including one or more openings;

providing a gap of determined dimension between the substrate surface and the mask to introduce a temperature difference between the mask and the substrate, wherein said gap is adjustable;

orienting a plurality of chemical precursor beams of at least one precursor species towards the mask with line of sight propagation, each of the plurality of chemical precursor beams being emitted from an independent punctual source, and molecules of the chemical precursor pass through the one or more mask openings to impinge onto the substrate surface for deposition thereon, at least a part of the chemical precursor molecules decomposing on the substrate surface at a decomposition temperature; and adjusting a temperature of the substrate surface greater or equal to the chemical precursor molecule decomposition temperature to remain greater than a mask temperature, and maintaining the mask temperature below the decomposition temperature, thereby causing a decomposition of the chemical precursor and a growth of a film on the substrate surface, but not on the mask, heating the substrate surface using a heating device, the mask temperature $T_m$ being a function of the temperature of the substrate surface $T_s$, wherein $T_m$ is less than $0.9 \times T_s$ in Kelvin, the gap inhibiting heat transfer by conduction, the substrate emitting a radiative heat flow towards the mask and the mask receiving said heat flow on one side and re-emitting a heat flow on both sides; wherein the chemical gas phase deposition process is operated under vacuum conditions below $10^{-5}$ mbar; wherein the substrate surface is positioned between the heating device and the mask and the distance of the mask to the substrate surface is smaller than the distance of the mask to the precursor sources.

* * * * *